(12) United States Patent
Kim et al.

(10) Patent No.: US 10,446,770 B2
(45) Date of Patent: Oct. 15, 2019

(54) ORGANIC LIGHT EMITTING DISPLAY DEVICE

(71) Applicant: Samsung Display Co., Ltd., Yongin-si, Gyeonggi-do (KR)

(72) Inventors: Minsang Kim, Suwon-si (KR); Seungwook Kwon, Hwaseong-si (KR); Ohjune Kwon, Hwaseong-si (KR); Hyojeong Kwon, Seoul (KR); Doohwan Kim, Yongin-si (KR)

(73) Assignee: Samsung Display Co., Ltd., Yongin-Si, Gyeonggi-do (KR)

(*) Notice: Subject to any disclaimer, the term of this patent is extended or adjusted under 35 U.S.C. 154(b) by 0 days.

(21) Appl. No.: 16/194,887

(22) Filed: Nov. 19, 2018

(65) Prior Publication Data
US 2019/0157589 A1    May 23, 2019

(30) Foreign Application Priority Data

Nov. 21, 2017  (KR) .......................... 10-2017-0155756

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3276* (2013.01); *H01L 51/5253* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 9,490,312 B2 | 11/2016 | Lee et al. | |
| 9,706,607 B2 | 7/2017 | Kim et al. | |
| 2013/0148312 A1* | 6/2013 | Han | H05K 7/00 361/736 |
| 2014/0042406 A1 | 2/2014 | Degner et al. | |
| 2014/0217382 A1* | 8/2014 | Kwon | H01L 51/0097 257/40 |

(Continued)

FOREIGN PATENT DOCUMENTS

KR   10-2014-0085956 A   7/2014
KR   10-2015-0014713 A   2/2015

*Primary Examiner* — Bilkis Jahan
(74) *Attorney, Agent, or Firm* — Lee & Morse, P.C.

(57) ABSTRACT

An OLED device includes a display panel including a display region and a pad region located at a first side of the display region. The pad region includes a bending region located in a portion of the pad region adjacent to the display region and in a pad electrode region located in a remaining portion of the pad region. A lower protection film is on a lower surface of the display panel and exposes a portion of the bending region. The lower protection film includes a first lower protection film including a first concave-convex pattern in the bending region adjacent to the display region. A second lower protection film is spaced apart from the first lower protection film and includes a second concave-convex pattern in the bending region adjacent to the pad electrode region. The second concave-convex pattern has a shape that is insertable into the first concave-convex pattern.

20 Claims, 21 Drawing Sheets

(56) References Cited

U.S. PATENT DOCUMENTS

| | | | | |
|---|---|---|---|---|
| 2014/0306941 A1* | 10/2014 | Kim | .................. | G06F 1/1652 345/204 |
| 2015/0137102 A1* | 5/2015 | Yang | .................. | B32B 37/144 257/40 |
| 2015/0382446 A1* | 12/2015 | Kwon | .................. | H05K 1/028 174/251 |
| 2016/0093644 A1* | 3/2016 | Ki | .................. | H01L 29/78672 257/40 |
| 2016/0155788 A1* | 6/2016 | Kwon | .................. | H01L 27/3276 257/40 |
| 2016/0181346 A1* | 6/2016 | Kwon | .................. | H01L 27/3276 257/40 |

\* cited by examiner

ORGANIC LIGHT EMITTING DISPLAY DEVICE

CROSS-REFERENCE TO RELATED APPLICATION(S)

Korean Patent Applications No. 10-2017-0155756, filed on Nov. 21, 2017, in the Korean Intellectual Property Office (KIPO), and entitled: "Organic Light Emitting Display Device," is incorporated by reference herein in its entirety.

BACKGROUND

1. Field

Example embodiments relate generally to organic light emitting display devices, for example, to flexible organic light emitting display devices.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted.

SUMMARY

Embodiments are directed to an organic light emitting display (OLED) device including a display panel having a display region where a plurality of pixels are disposed and a pad region located in a first side of the display region. The pad region, where pad electrodes are disposed, includes a bending region located in a portion of the pad region that is adjacent to the display region and in a pad electrode region located in a remaining portion of the pad region. A lower protection film is on a lower surface of the display panel such that a portion of the bending region is exposed. The lower protection film includes a first lower protection film including a first concave-convex pattern in a portion of the bending region located adjacent to the display region; and a second lower protection film spaced apart from the first lower protection film. The second lower protection film includes a second concave-convex pattern in a portion of the bending region located adjacent to the pad electrode region. The second concave-convex pattern has a shape that is insertable into the first concave-convex pattern.

The first lower protection film may be located in the display region and in a portion of the bending region that is located adjacent to the display region. The second lower protection film may be located in the pad electrode region and in a portion of the bending region that is located adjacent to the pad electrode region.

The first concave-convex pattern may include two adjacent first convex portions and a first concave portion that is located between the two adjacent first convex portions. The second concave-convex pattern may include two adjacent second concave portions and a second convex portion that is located between the adjacent two second concave portions.

The two adjacent first convex portions may face the two adjacent second concave portions. The first concave portion may face the second convex portion.

Each of the first convex portions may protrude in a direction from the display region into the bending region. The second convex portion may protrude in a direction from the pad electrode region into the bending region. A first empty space that is located between the two adjacent first convex portions may be defined as the first concave portion. Second and third empty spaces that are located in both lateral portions of the second convex portion may be defined as the second concave portions.

Each of the first and second lower protection films may have a first thickness in the display region and the pad region. Each of the first and second convex portions may have a second thickness in the bending region. The first thickness may be less than the second thickness.

The lower protection film may have a zipper shape in the bending region when viewed in a plan view of the OLED device.

The first concave-convex pattern may include a plurality of first convex portions and a plurality of first concave portions. The first convex portion and the first concave portion may be alternately arranged in a first direction that is parallel to an upper surface of the lower protection film. The second concave-convex pattern may be spaced apart from the first concave-convex pattern and may include a plurality of second convex portions and a plurality of second concave portions. The second convex portion and the second concave portion may be alternately arranged in the first direction.

Each of the first convex portions may face a corresponding one of the second concave portions. Each of the first concave portions may face a corresponding one of the second convex portions.

The number of first convex portions may be the same as the number of second concave portions. The number of first concave portions may be the same as the number of second convex portions.

The first convex portion may protrude in a second direction that is perpendicular to the first direction. The second convex portion may protrude in a third direction that is opposite to the second direction. The first and second convex portions may protrude in a fourth direction that is vertical to the first, second, and third direction.

The first concave portion may include a recess toward the third direction from the bending region. The second concave portion may include a recess toward the second direction from the bending region.

The first and second concave portions may expose a lower surface of the display panel located in the bending region.

The first convex portion may be insertable into the second concave portion and the second convex portion may be insertable into the first concave portion when the bending region of the OLED device is bent.

An upper surface of the first convex portion may be in contact with a lower surface of the display panel located adjacent to the pad electrode region and an upper surface of the second convex portion may be in contact with a lower surface of the display panel located adjacent to the display region when the bending region of the OLED device is bent.

The second direction may be a direction from the display region into the pad region. The third direction may be a direction from the pad region into the display region. The fourth direction may be a direction from the display panel into the lower protection film. The bending region may be bendable on an axis with respect to the first direction.

Each of the pixels included in the display panel may include a substrate on the lower protection film, a semiconductor element on the substrate, a lower electrode on the semiconductor element, a light emitting layer on the lower electrode, an upper electrode on the light emitting layer, and a thin film encapsulation structure on the upper electrode.

The semiconductor element may include an active layer on the substrate, a gate insulation layer on the active layer, a gate electrode on the gate insulation layer, an insulating interlayer on the gate electrode, and source and drain electrode on the insulating interlayer.

The thin film encapsulation structure may include a first thin film encapsulation layer on the upper electrode and including inorganic materials, a second thin film encapsulation layer on the first thin film encapsulation layer and including organic materials, and a third thin film encapsulation layer on the second thin film encapsulation layer and the inorganic materials. The substrate and the thin film encapsulation structure may include materials having a flexibility.

The OLED device may further include a touch screen electrode layer and a polarizing layer disposed on the display panel.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
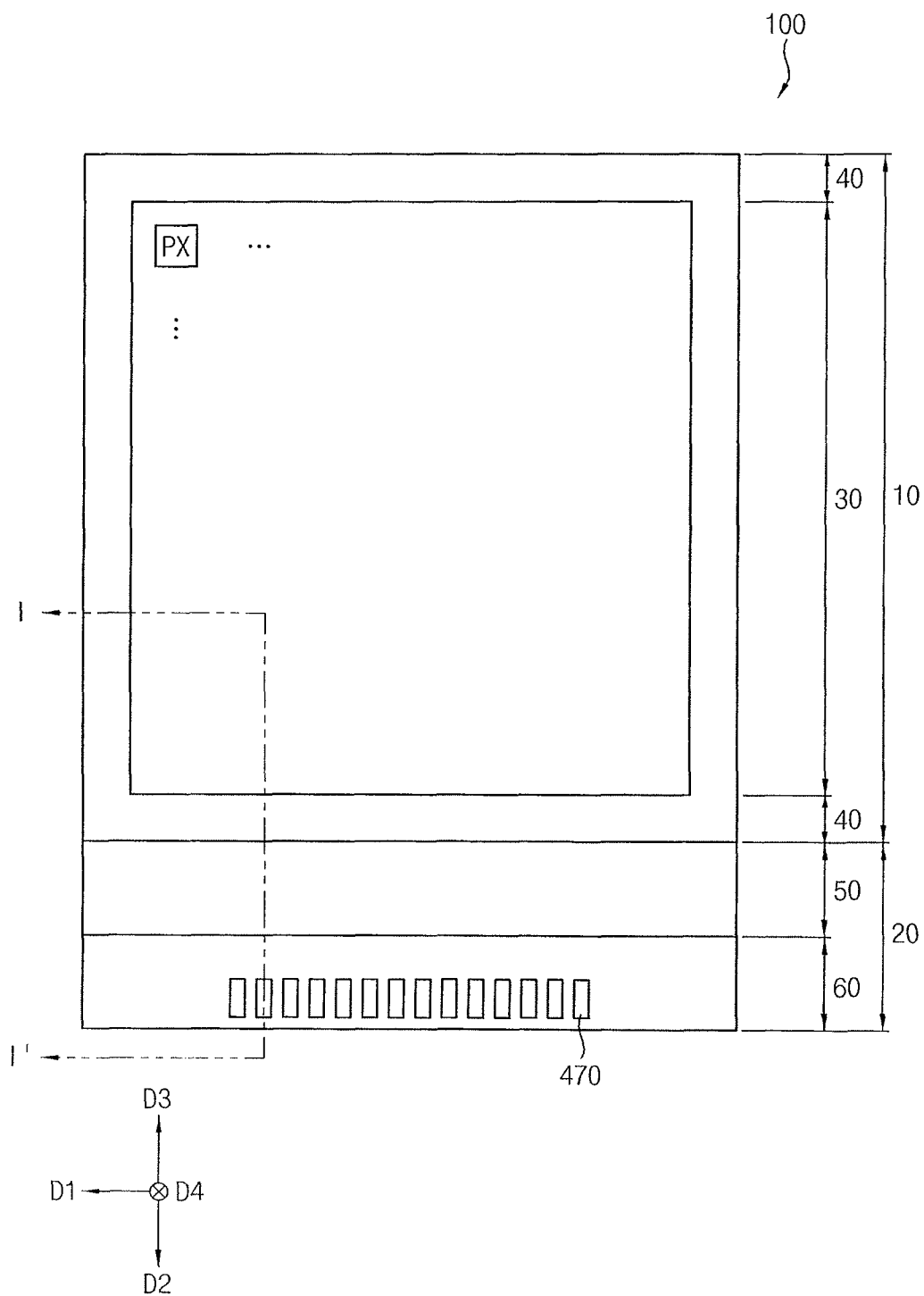
FIG. 1 illustrates a plan view of an organic light emitting display (OLED) device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
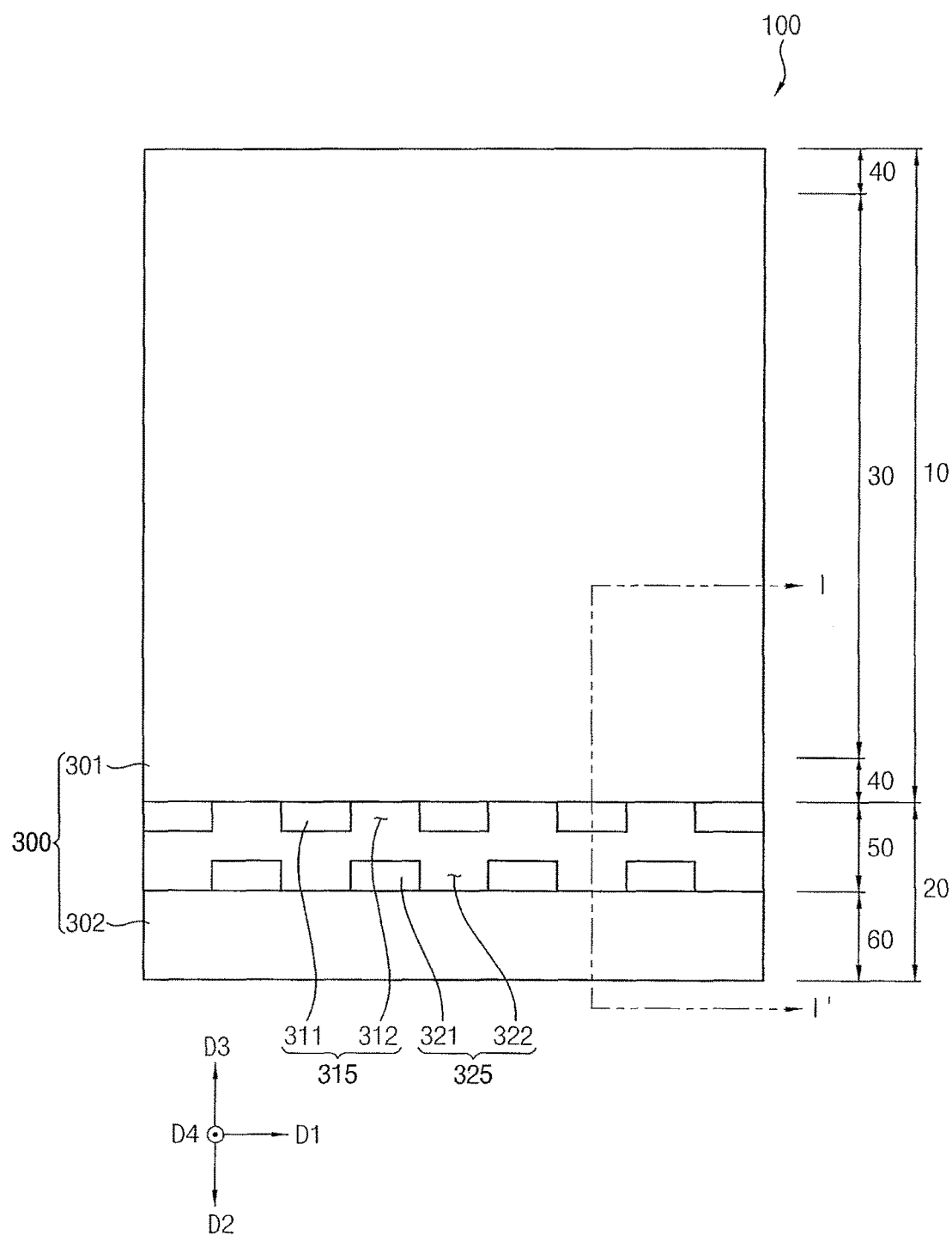
FIG. 2 illustrates a plan view of a lower surface of the OLED device of FIG. 1.
Figure 3:
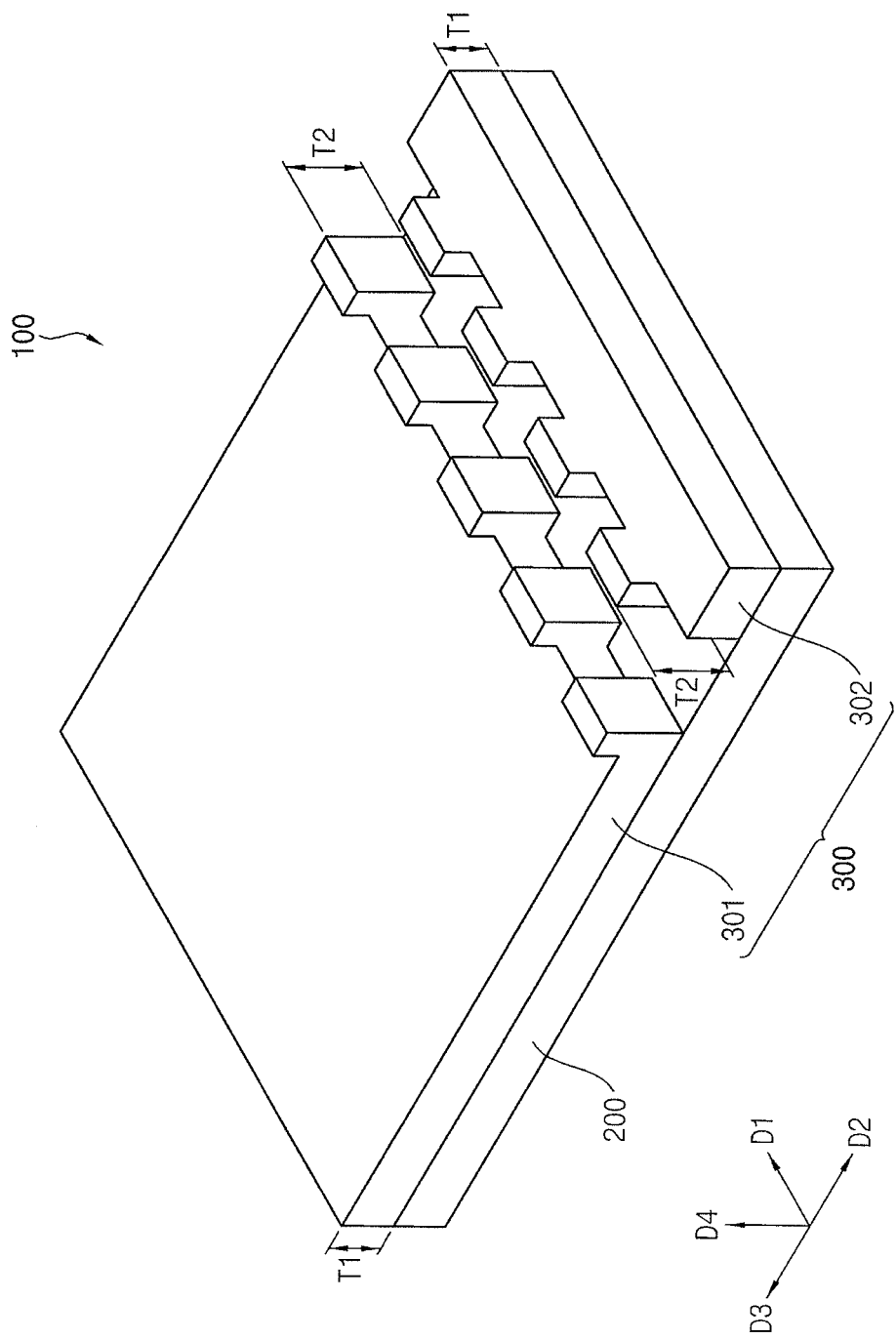
FIG. 3 illustrates a perspective view of a lower surface of the OLED device of FIG. 1.
Figure 4:
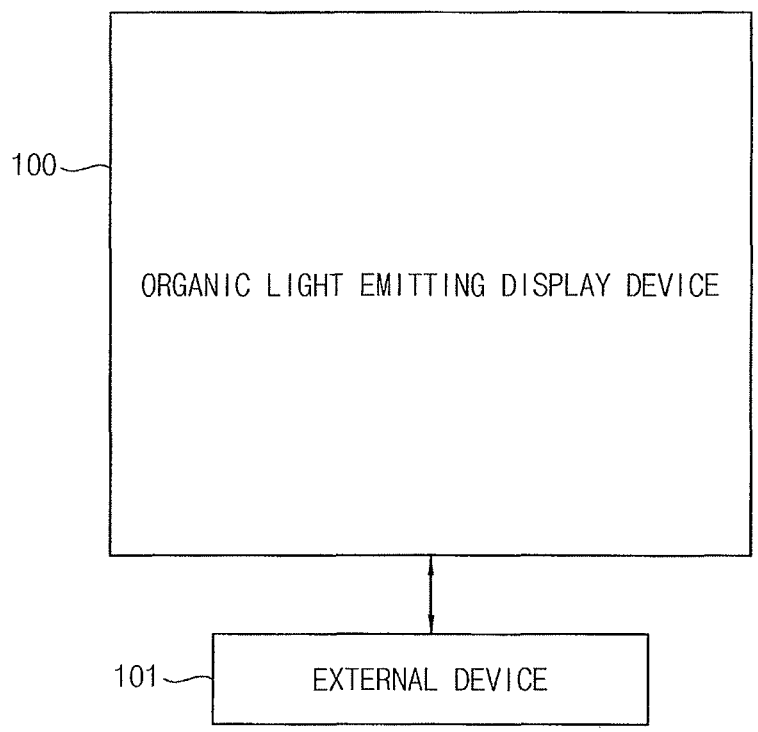
FIG. 4 illustrates a block diagram for describing an external device electrically connected to the OLED device of FIG. 1.

FIG. 1 illustrates a plan view of an organic light emitting display (OLED) device in accordance with example embodiments, and FIG. 2 illustrates a plan view of a lower surface of the OLED device of FIG. 1. FIG. 3 illustrates a perspective view of a lower surface of the OLED device of FIG. 1, and FIG. 4 is a block diagram for describing an external device electrically connected to the OLED device of FIG. 1.

Referring to FIGS. 1, 2, 3, and 4, an OLED device 100 may include a display panel 200, an upper structure, a lower protection film 300, etc.

The display panel 200 may include a display region 10 and a pad region 20. A plurality of pixels PX may be disposed in the display region 10. The pad region 20 may be located at a first side of the display region 10. Pad electrodes 470 may be disposed in the pad region 20. The pad electrodes 470 may be electrically connected to an external device 101. In some implementations, a width of the pad region 20 may be less than a width of the display region 10.

The display region 10 may include a light emitting region 30 where light is emitted and a peripheral region 40 that surrounds the light emitting region 30. The pixels PX emitting light may be disposed in the light emitting region 30. A plurality of wirings may be disposed in the peripheral region 40. The wirings may be electrically connected to the pad electrodes 470 and the pixels PX. For example, the wirings may include data signal wirings, scan signal wirings, light emission signal wirings, power supply voltage wirings, etc. In addition, a scan driver, a data driver, etc., may be disposed in the peripheral region 40.

In some implementations, a width of the peripheral region 40 surrounding the light emitting region 30 of FIG. 1 may be the same.

The pad region 20 may include a bending region 50 located in a portion of the pad region 20 that is adjacent to the display region 10 and a pad electrode region 60 located in a remaining portion of the pad region 20. For example, the bending region 50 may be interposed between the display region 10 and the pad electrode region 60. The pad electrodes 470 may be disposed in the pad electrode region 60. When the bending region 50 is bent, the pad electrode region 60 may become located on a lower surface of the OLED device 100. In some implementations, the OLED device 100 may further include a bending protection layer and connection electrodes. The bending protection layer may be disposed in a portion of the display region 10, the bending region 50, and a portion of the pad electrode region 60 on the display panel 200. The connection electrodes may be disposed between the bending protection layer and the display panel 200, and may be electrically connected to the wirings and the pad electrodes 470. The pixels PX disposed in the light emitting region 30 and the external device 101 that is electrically connected to the pad electrodes 470 may be electrically connected through the connection electrodes disposed in the bending region 50 and the wirings disposed in the peripheral region 40. For example, the external device 101 and the OLED device 100 may be electrically connected through a flexible printed circuit board (FPCB). The external device 101 may provide a data signal, a scan signal, a light emission signal, a power supply voltage, etc., to the OLED device 100. In addition, a driving integrated circuit may be mounted (e.g., installed) in the FPCB. In some implementations, the driving integrated circuit may be mounted in a portion of the display panel 200 that is located adjacent to the pad electrodes 470.

The upper structure may be disposed on the display panel 200 in the display region 10. The upper structure may include a touch screen electrode layer, a polarizing layer, etc. In example embodiments, the touch screen electrode layer may be disposed on the display panel, and the polarizing layer may be disposed on the touch screen electrode layer. In some implementations, the polarizing layer may be disposed on the display panel 200, and the touch screen electrode layer may be disposed on the polarizing layer.

As illustrated in FIGS. 2 and 3, the lower protection film 300 may be disposed on a lower surface of the display panel 200 such that a portion of the display panel 200 in the bending region 50 is exposed. The lower protection film 300 may include a first lower protection film pattern 301 and a second lower protection film pattern 302, the second lower protection film pattern 302 being spaced apart form the first lower protection film pattern 301. In some implementations, the lower protection film 300 may be in direct contact with a lower surface of the display panel 200. The first lower protection film pattern 301 may be disposed in the display region 10 and in a portion of the bending region 50 that is located adjacent to the display region 10. The second lower protection film pattern 302 may be disposed in the pad electrode region 60 and in a portion of the bending region 50 that is located adjacent to the pad electrode region 60. The first lower protection film pattern 301 may include a first concave-convex pattern 315 in a portion of the bending region 50 that is located adjacent to the display region 10. The second lower protection film pattern 302 may include a second concave-convex pattern 325 in a portion of the bending region 50 that is located adjacent to the pad electrode region 60. The second concave-convex pattern 325 may have a shape that is insertable into the first concave-convex pattern 315. The first concave-convex pattern 315 may be spaced apart from the second concave-convex pattern 325. In some implementations, a portion of the first concave-convex pattern 315 may be in contact with a portion of the second concave-convex pattern 325.

In some implementations, the first concave-convex pattern 315 may include first convex portions 311 and first concave portions 312. The first convex portions 311 and the first concave portions 312 may be alternately arranged in a first direction D1 that is parallel to an upper surface of the lower protection film 300. The second concave-convex pattern 325 may include second convex portions 321 and second concave portions 322. The second convex portions 321 and the second concave portions 322 may be alternately arranged in the first direction D1. Each of the first convex portions 311 may face (or correspond to) one of the second concave portions 322, and each of the first concave portions 312 may face one of the second convex portions 321. For example, the number of the first convex portions 311 may be the same as the number of the second concave portions 322, and the number of second convex portions 321 may be the same as the number of the first concave portions 312.

Figure 8:
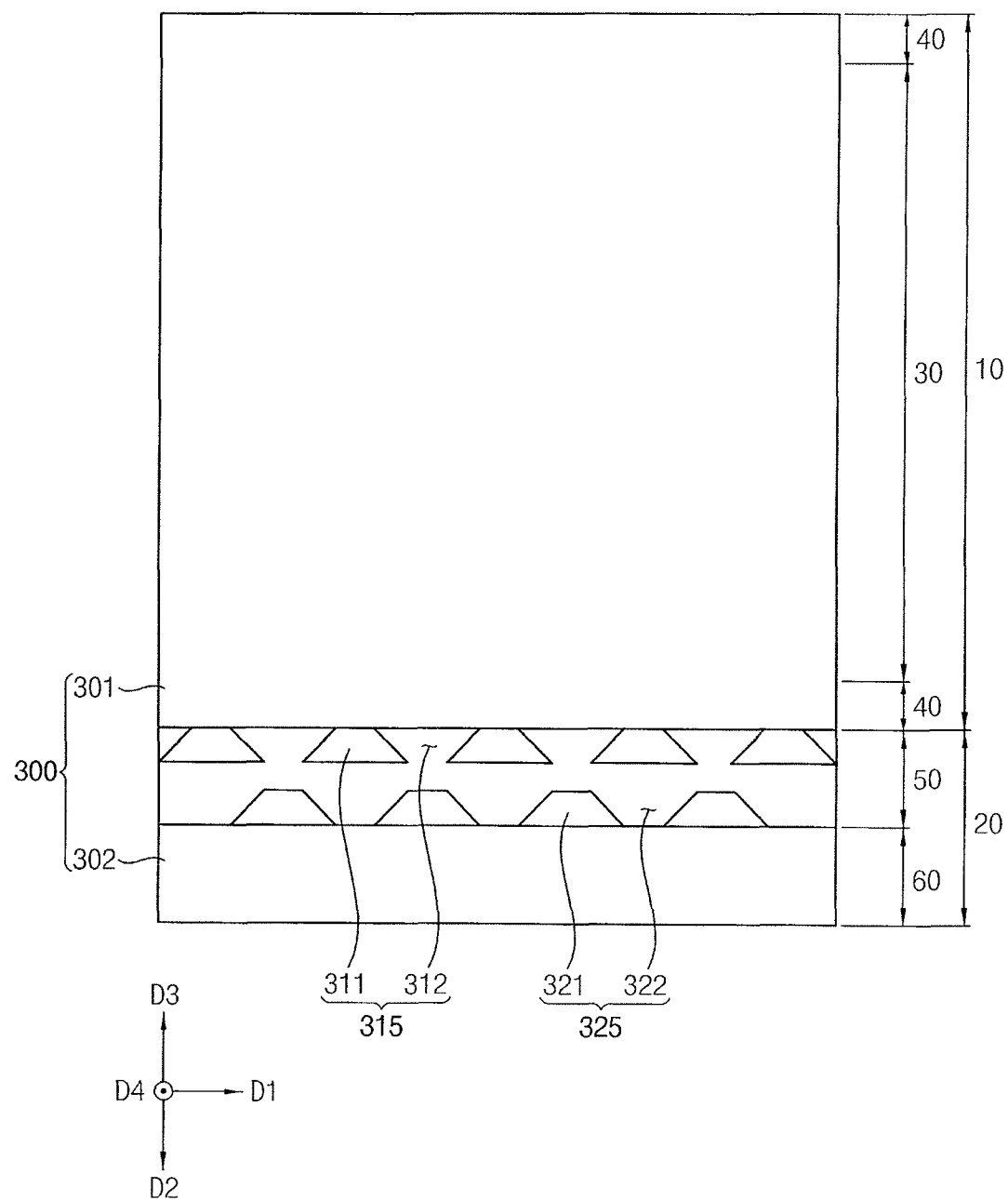
FIG. 8 illustrates a plan view of an example of a lower protection film included in the OLED device of FIG. 1.
Figure 9:
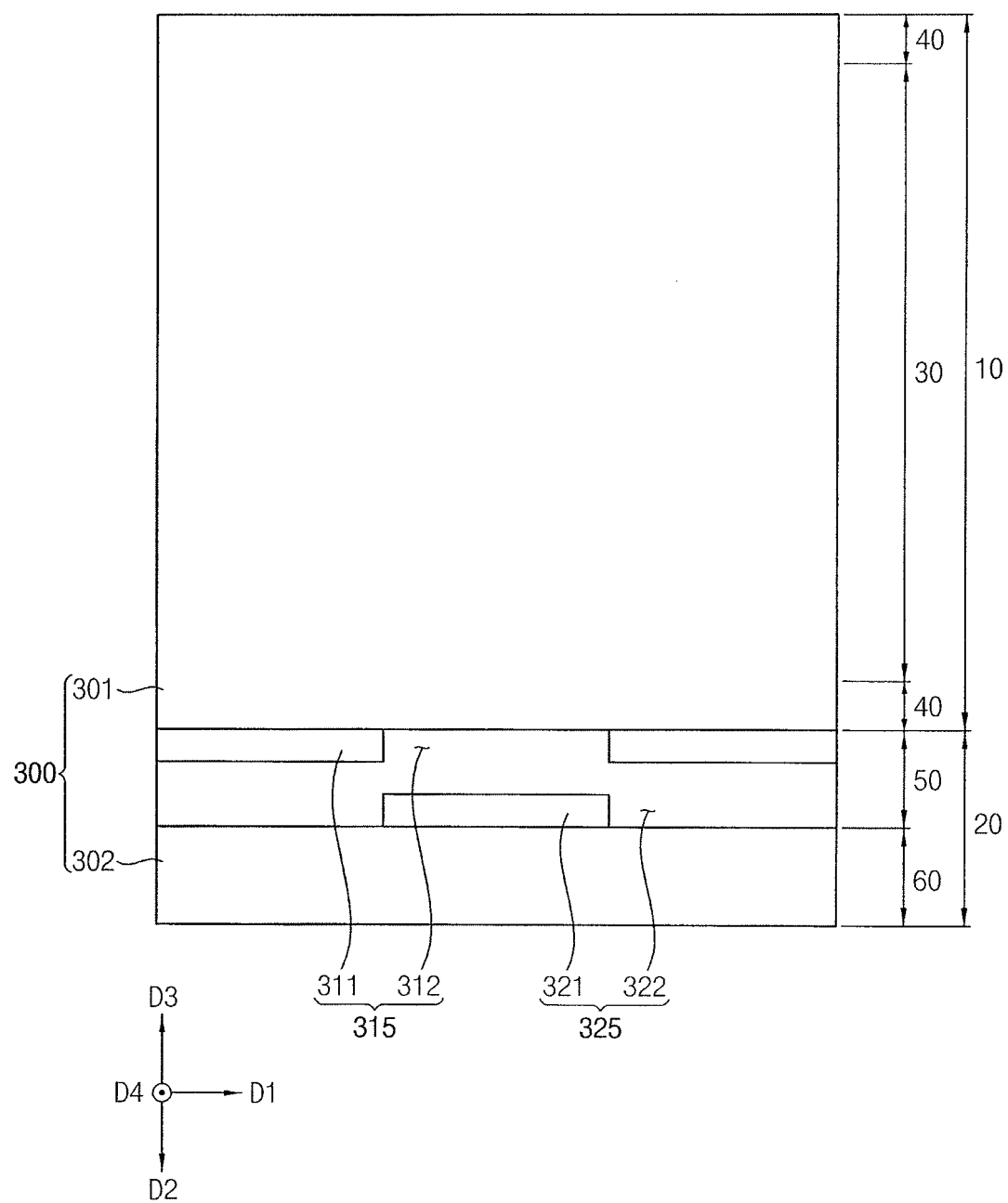
FIG. 9 illustrates a plan view of another example of a lower protection film included in the OLED device of FIG. 1.

As illustrated in FIG. 2, the lower protection film 300 may have a zipper shape in the bending region 50 when viewed in a plan view of the OLED device 100. The first convex portions 311, the first concave portion 312, the second convex portion 321, and the second concave portions 322 may have various shapes capable of being combined to each other when the bending region 50 is bent. For example, each of the first convex portions 311, the first concave portions 312, the second convex portions 321, and the second concave portions 322 may have a plan shape of a tetragon. In some implementations, each of the first convex portions 311, the first concave portions 312, the second convex portions 321, and the second concave portions 322 may have a plan shape of a trapezoid, as illustrated in FIG. 8. As illustrated in FIG. 9, the first concave-convex pattern 315 may include two first convex portions 311 and one first concave portion 312, and the second concave-convex pattern 325 may include one second convex portion 321 and two second concave portions 322, and each of the first convex portions 311, the first concave portion 312, the second convex portion 321, and the second concave portions 322 may have a plan shape of a tetragon.

In some implementations embodiments, the first convex portion 311 may protrude in a second direction D2 that is perpendicular to the first direction D1, and the second convex portion 321 may protrude in a third direction D3 that is opposite to the second direction D2, as illustrated in FIG. 2. In addition, each of the first convex portion 311 and the second convex portion 321 may protrude in a fourth direction D4 that is vertical to the first direction D1, the second direction D2, and the third direction D3 (refer to FIG. 3). The second direction D2 may be a direction from the display region 10 into the pad region 20, and the third direction D3 may be a direction from the pad region 20 into the display region 10. The fourth direction D4 may be a direction from the display panel 200 into the lower protection film 300.

In some implementations, the first concave portion 312 may include a recess toward the third direction D3 from the bending region 50, and the second concave portion 322 may include a recess toward the second direction D2 from the bending region 50, as illustrated in FIG. 2. Each of the first concave portion 312 and the second concave portion 322 may expose a lower surface of the display panel 200 that is located in the bending region 50.

Accordingly, when the bending region 50 of the OLED device 100 is bent on an axis with respect to the first direction D1, each of the first convex portions 311 may be inserted into (or combined with) each of the second concave portions 322, and each of the second convex portions 321 may be inserted into each of the first concave portion 312. For example, the first concave-convex pattern 315 and the second concave-convex pattern 325 may have complementary shapes that provide an interengaging structure when the bending region 50 of the OLED device 100 is bent on an axis with respect to the first direction D1. Moreover, when the bending region 50 of the OLED device 100 is bent on an axis with respect to the first direction D1, an upper surface of the first convex portion 311 may be in direct contact with a lower surface of the display panel 200 located adjacent to the pad electrode region 60, and an upper surface of the second convex portion 321 may be in direct contact with a lower surface of the display panel 200 located adjacent to the display region 10.

For example, the first concave-convex pattern 315 may include adjacent two first convex portions 311 and one first concave portion 312 that is located between the adjacent two first convex portion 311, and the second concave-convex pattern 325 may include adjacent two second concave portions 322 and one second convex portion 321 located between the adjacent two second concave portion 322. The adjacent two first convex portions 311 may face the adjacent two second concave portions 322, and the second convex portion 321 may face the second concave portion 322. In addition, each of the first convex portions 311 may protrude in a direction from the display region 10 into the bending region 50 (e.g., in the second direction D2), and the second convex portion 321 may protrude in a direction from the pad electrode region 60 into the bending region 50 (e.g., in the third direction D3). Each of the first convex portion 311 and the second convex portion 321 may protrude in a direction that is vertical to the lower protection film 300 (e.g., in the fourth direction D4). Further, a first empty space that is located between the adjacent two first convex portions 311 may be defined as the first concave portion 312, and second and third empty spaces that are located in both lateral portions of the second convex portion 321 may be defined as the second concave portions 322. In some implementations, each of the first lower protection film pattern 301 and the second lower protection film pattern 302 may have a first thickness T1 in the display region 10 and the pad electrode region 60, and each of the first and second convex portions 311 and 321 may have a second thickness T2 that is greater than the first thickness T1.

Figure 5:
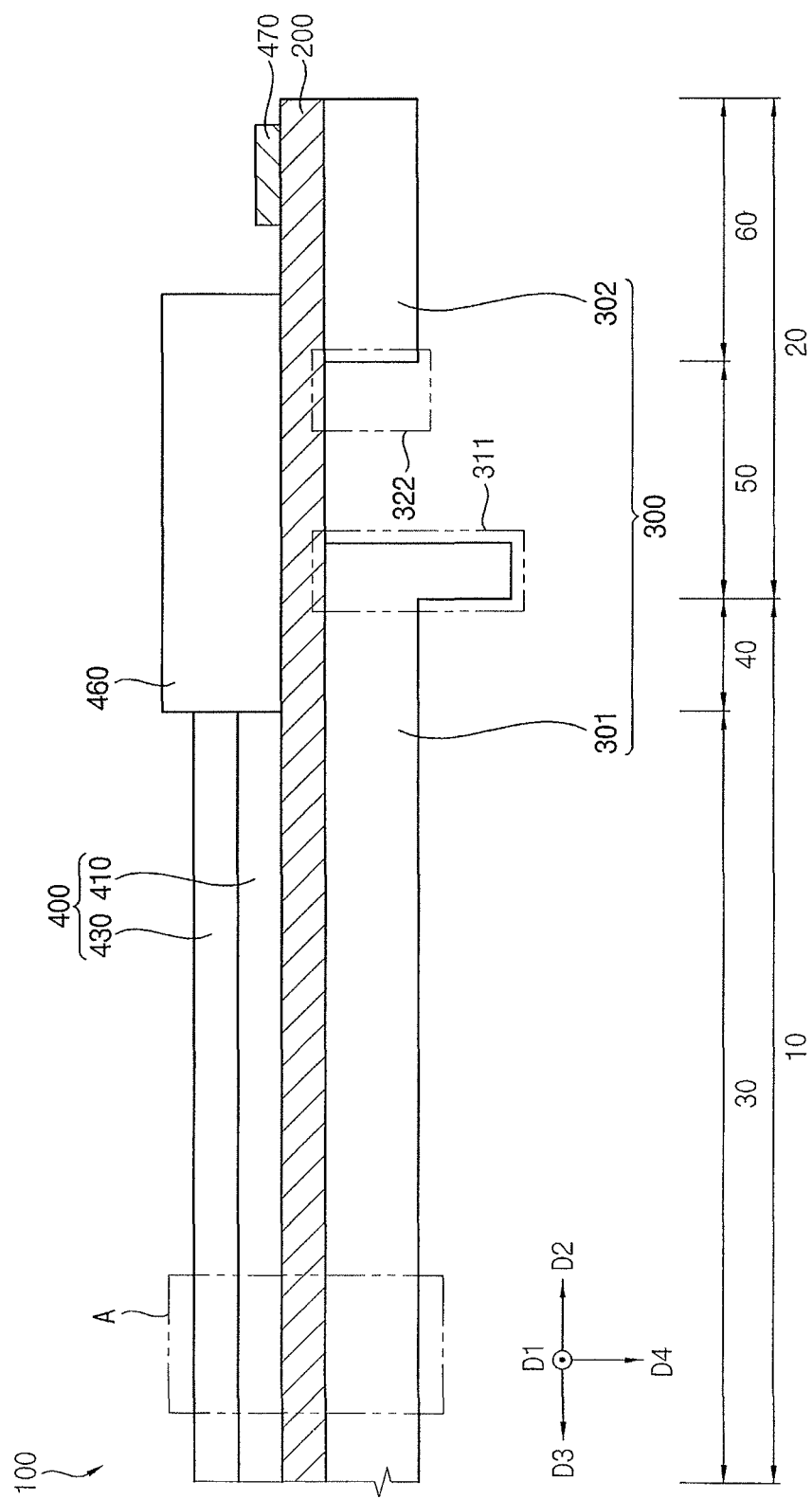
FIG. 5 illustrates a cross-sectional view taken along a line I-I' of FIGS. 1 and 2.
Figure 6:
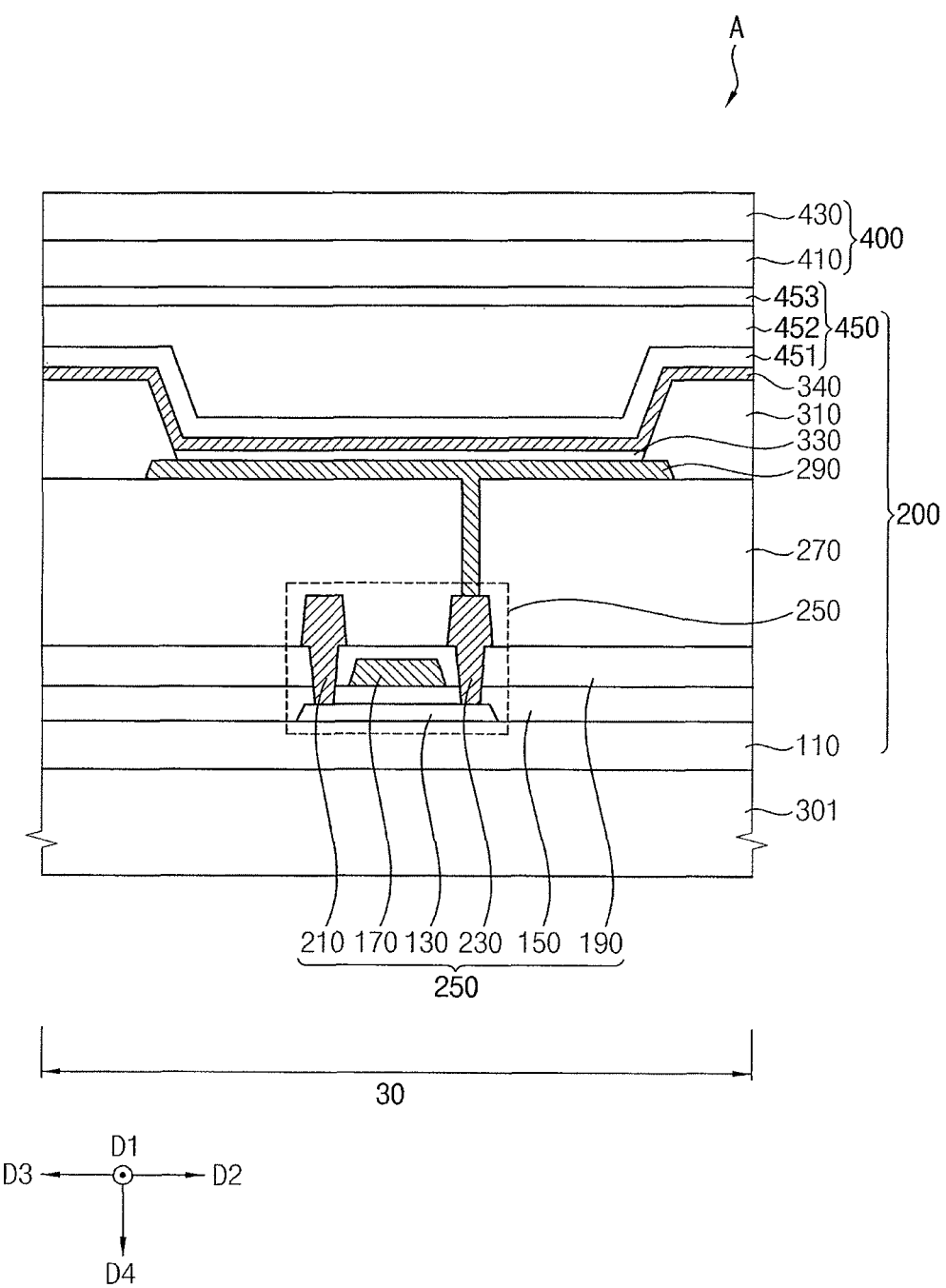
FIG. 6 illustrates an enlarged cross-sectional view corresponding to region 'A' of FIG. 5.
Figure 7:
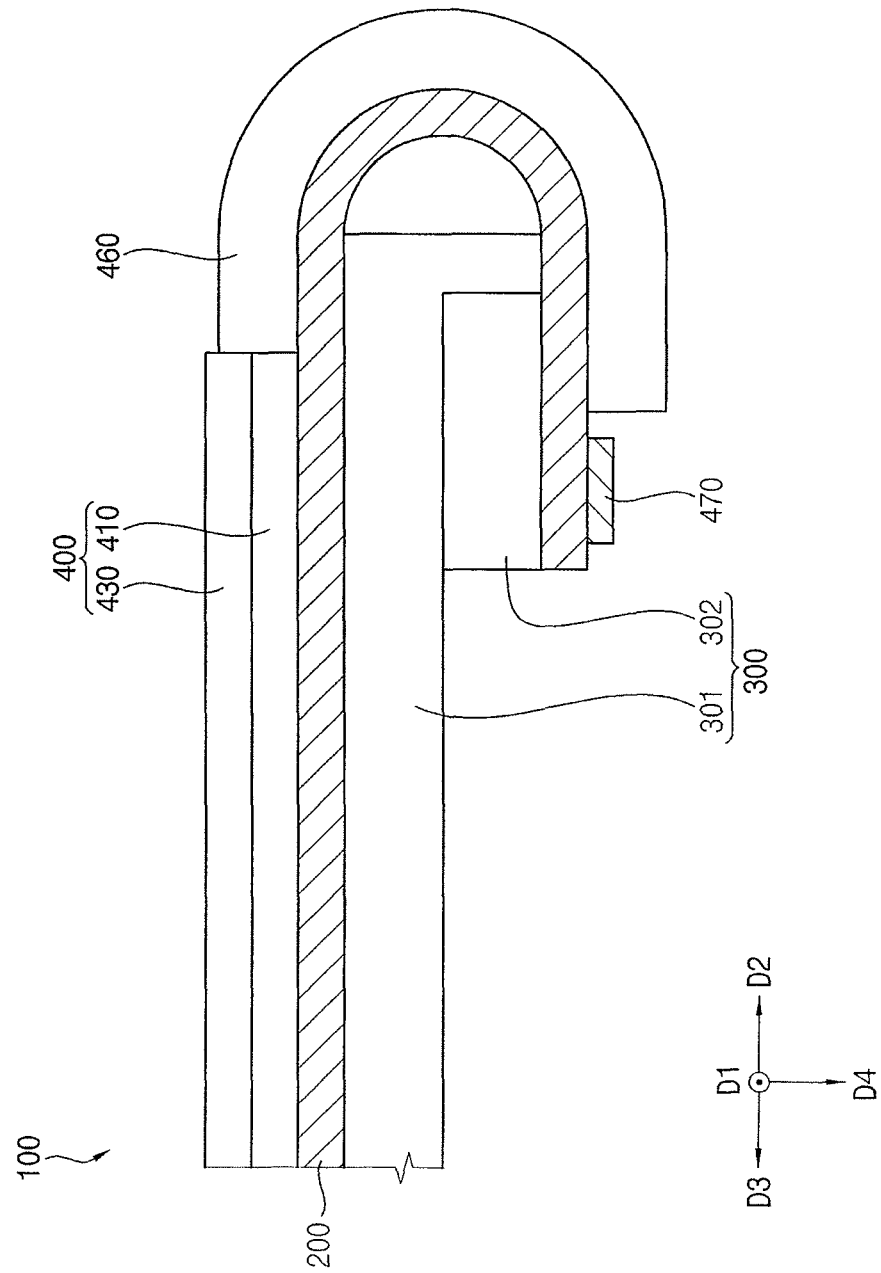
FIG. 7 illustrates a cross-sectional view for describing a bent shape of the OLED device of FIG. 5.

FIG. 5 illustrates a cross-sectional view taken along a line I-I' of FIGS. 1 and 2, and FIG. 6 illustrates an enlarged cross-sectional view corresponding to region 'A' of FIG. 5. FIG. 7 illustrates a cross-sectional view for describing a bent shape of the OLED device of FIG. 5, and FIG. 8 illustrates a plan view of an example of a lower protection film included in the OLED device of FIG. 1. FIG. 9 illustrates a plan view of another example of a lower protection film included in the OLED device of FIG. 1.

Referring to FIGS. 5, 6, and 7, the OLED device 100 may include a display panel 200, a lower protection film 300, an upper structure 400, a bending protection layer 460, a pad electrode 470, etc. The lower protection film 300 may include a first lower protection film pattern 301 and a second lower protection film pattern 302. In addition, the upper structure 400 may include a polarizing layer 430 and a touch screen electrode layer 410.

As described above, the display panel 200 may have a display region 10 and a pad region 20. The display region 10 may include a light emitting region 30 and a peripheral region 40. The pad region 20 may include a bending region 50 and a pad electrode region 60. In example embodiments, pixels PX where a light is emitted may be disposed in the light emitting region 30, and a plurality of wirings may be disposed in the peripheral region 40. The wirings may be electrically connected to the pad electrodes 470 and the pixels PX. The bending region 50 may be interposed between the pad electrode region 60 and the peripheral region 40 of the display region 10, and the pad electrode 470 may be disposed in the pad electrode region 60.

Referring again to FIG. 5, the upper structure 400 may be disposed in the display region 10 on the display panel 200. In some implementations, the touch screen electrode layer 410 may be disposed on the display panel 200, and the polarizing layer 430 may be disposed on the touch screen electrode layer 410.

The lower protection film 300 may be disposed on a lower surface of the display panel 200. In example embodiments, the lower protection film 300 may include a first lower protection film pattern 301 and a second lower protection film pattern 302. The first lower protection film pattern 301 may be disposed in the display region 10 and a portion of the bending region 50 that is located adjacent to the display region 10 The second lower protection film pattern 302 may be disposed in the pad electrode region 60 and a portion of the bending region 50 located adjacent to the pad electrode region 60. The first lower protection film pattern 301 and the second lower protection film pattern 302 may be spaced apart from each other in the bending region 50 The lower protection film 300 may expose a portion of a lower surface of the display panel 200 in the bending region 50.

The bending protection layer 460 may be disposed in a portion of the display region 10, the bending region 50, and a portion of the pad electrode region 60 on the display panel 200. In some implementations, connection electrodes disposed in the bending region 50 of the display panel 200 may be located under the bending protection layer 460. The connection electrodes may electrically connect wirings disposed in the peripheral region 40 and the pad electrode 470. The pixels PX disposed in the light emitting region 30 and an external device 101 (refer to FIG. 4) that is electrically connected to the pad electrode 470 may be electrically connected through the connection electrodes disposed in the bending region 50 and the wirings disposed in the peripheral region 40. In example embodiments, a thickness of the bending protection layer 460 may be determined such that a neutral plane in the bending region 50 is located within a portion where the connection electrodes are disposed. The bending protection layer 460 may protect the connection electrodes, and may raise a neutral plane of the bending region 50 in a direction that is opposite to the fourth direction D4. For example, when the bending region 50 is bent, breaking or cutting of the connection electrodes may be prevented because the neutral plane of the bending region 50 is located within the portion where the connection electrodes are disposed. The bending protection layer 460 may include organic materials.

As illustrated in FIG. 6, the OLED device 100 may include the display panel 200, the first lower protection film pattern 301 of the lower protection film 300, the upper structure 400, etc. The display panel 200 may include a substrate 110, a semiconductor element 250, a planarization layer 270, a pixel defining layer 310, a lower electrode 290, a light emitting layer 330, an upper electrode 340, and a thin film encapsulation (TFE) structure 450. In addition, the upper structure 400 may include the touch screen electrode layer 410 and the polarizing layer 430. The semiconductor element 250 may include an active layer 130, a gate insulation layer 150, a gate electrode 170, an insulating interlayer 190, a source electrode 210, and a drain electrode 230. The TFE structure 450 may include a first TFE layer 451, a second TFE layer 452, and a third TFE layer 453.

When the OLED device 100 includes the flexible substrate 110 and the TFE structure 450, the OLED device 100 may serve as a flexible OLED device.

The substrate 110 including transparent materials or opaque materials may be provided. The substrate 110 may be formed of a flexible transparent material such as a flexible transparent resin substrate (e.g., a polyimide substrate). For example, the polyimide substrate may include a first polyimide layer, a first barrier film layer, a second polyimide layer, a second barrier film layer, etc. A polyimide substrate may be relatively thin and flexible. It may be difficult to directly form the semiconductor element 250 and the light emitting structure on the polyimide substrate because the polyimide substrate is relatively thin and flexible. Accordingly, the semiconductor element 250 and a light emitting structure may be formed on the polyimide substrate and a rigid glass substrate, and then the polyimide substrate may serve as the substrate 110 of the OLED device 100 after the removal of the rigid glass substrate. For example, the polyimide substrate may be disposed on a rigid glass substrate to help support the formation of the semiconductor element 250 and the light emitting structure (e.g., the lower electrode 290, the light emitting layer 330, the upper electrode 340, etc.). The substrate 110 may have a structure in which the first polyimide layer, the first barrier film layer, the second polyimide layer, and the second barrier film layer are stacked on the rigid glass substrate. In a manufacturing the OLED device 100, after an insulating layer (e.g., a buffer layer) is provided on the second barrier layer of the polyimide substrate, the semiconductor element 250 and the light emitting structure may be disposed on the insulating layer. After the semiconductor element 250 and the light emitting structure are formed on the insulating layer, the rigid glass substrate on which the polyimide substrate is disposed may be removed. In some implementations, the substrate 110 may include a quartz substrate, a synthetic quartz substrate, a calcium fluoride substrate, a fluoride-doped quartz substrate, a soda lime glass substrate, a non-alkali glass substrate etc.

A buffer layer may be disposed on the substrate 110. The buffer layer may be disposed on the entire substrate 110. The buffer layer may include, for example, silicon compound, metal oxide, etc. The buffer layer may prevent the diffusion of metal atoms and/or impurities from the substrate 110 into the semiconductor element 250. Additionally, the buffer layer may control a rate of a heat transfer in a crystallization process for forming the active layer 130, thereby providing a substantially uniform active layer 130. Further, the buffer layer may improve a surface flatness of the substrate 110 when a surface of the substrate 110 is relatively irregular. According to a type of the substrate 110, at least two buffer layers may be provided on the substrate 110, or the buffer layer may be omitted.

The semiconductor element 250 may be disposed on the substrate 110. The active layer 130 may be disposed on the substrate 110. The active layer 130 may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130, and may also be disposed on the substrate 110. For example, the gate insulation layer 150 may sufficiently cover the active layer 130 on the substrate 110, and may have a substantially level surface without a step where the gate insulating layer 150 crosses the active layer 130. In some implementations, the gate insulation layer 150 may cover the active layer 130 and may be disposed as a substantially uniform thickness along a profile of the active layer 130. The gate insulation layer 150 may include silicon compound, metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed on a portion of the gate insulation layer 150 under which the active layer 130 is located. The gate electrode 170 may include a metal, a metal alloy, metal nitride, conductive metal oxide, transparent conductive materials, etc. For example, the gate electrode 170 may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), tin oxide (SnOx), indium oxide (InOx), gallium oxide (GaOx), indium tin oxide (ITO), indium zinc oxide (IZO), etc. These may be used alone or in a suitable combination thereof. In some example embodiments, the gate electrode 170 may have a multi-layered structure.

The insulating interlayer 190 may be disposed on the gate electrode 170. The insulating interlayer 190 may include a silicon compound, a metal oxide, etc. The insulating interlayer 190 may be disposed on the gate insulation layer 150 and may cover the gate electrode 170. For example, the insulating interlayer 190 may sufficiently cover the gate electrode 170 on the gate insulation layer 150, and may have a substantially level surface without a step where the insulating interlayer 190 crosses the gate electrode 170. In some implementations, the insulating interlayer 190 may cover the gate electrode 170 on the gate insulation layer 150, and may be disposed as a substantially uniform thickness along a profile of the gate electrode 170.

The source electrode 210 and the drain electrode 230 may be disposed on the insulating interlayer 190. The source electrode 210 may be in direct contact with a first side of the active layer 130 via a contact hole formed by removing a portion of the gate insulation layer 150 and the insulating interlayer 190. The drain electrode 230 may be in direct contact with a second side of the active layer 130 via a contact hole formed by removing another portion of the gate insulation layer 150 and the insulating interlayer 190. The source electrode 210 and the drain electrode 230 may include a metal, an alloy, metal nitride, conductive metal oxide, transparent conductive materials, etc. These may be used alone or in a suitable combination thereof. In some example embodiments, each of the source and drain electrodes 210 and 230 may have a multi-layered structure. Accordingly, the semiconductor element 250 including the active layer 130, the gate insulation layer 150, the gate electrode 170, the insulating interlayer 190, the source electrode 210, and the drain electrode 230 may be disposed.

In some implementations, the semiconductor element 250 may have a top gate structure. In some implementations, the semiconductor element 250 may have a bottom gate structure.

The planarization layer 270 may be disposed on the source electrode 210 and the drain electrode 230. The planarization layer 270 may cover the source electrode 210 and the drain electrode 230, and may be disposed on the entire insulating interlayer 190. In some implementations, the planarization layer 270 may have sufficient thickness to cover the source and drain electrodes 210 and 230. In this case, the planarization layer 270 may have a substantially flat upper surface, and a planarization process may be further performed on the planarization layer 270 to provide the flat upper surface of the planarization layer 270. In some implementations, the planarization layer 270 may cover the source and drain electrodes 210 and 230, and may be disposed with a substantially uniform thickness along a profile of the source and drain electrodes 210 and 230. The planarization layer 270 may include organic materials or inorganic materials. In some implementations, the planarization layer 270 may include organic materials. For example, the planarization layer 270 may include inorganic materials such as SiOx, SiNx, SiOxNy, SiOxCy, SiCxNy, etc. In some implementations, the planarization layer 270 may include organic materials such as a photoresist, a polyacryl-based resin, a polyimide-based resin, a polyamide-based resin, a siloxane-based resin, an acryl-based resin, an epoxy-based resin, etc.

The lower electrode 290 may be disposed on the planarization layer 270. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may include a metal, a metal alloy, metal nitride, conductive metal oxide, transparent conductive materials, etc. These may be used alone or in a suitable combination thereof. In some example embodiments, the lower electrode 290 may have a multi-layered structure.

The pixel defining layer 310 may be disposed on the planarization layer 270, and may expose a portion of the lower electrode 290. The pixel defining layer 310 may include organic materials or inorganic materials. In some implementations, the pixel defining layer 310 may include organic materials.

The light emitting layer 330 may be disposed on a portion of the lower electrode 290 exposed from the pixel defining layer 310. The light emitting layer 330 may be formed using at least one of light emitting materials capable of generating different colors of light (e.g., a red color of light, a blue color of light, and a green color of light, etc.) according to sub-pixels. In some implementations, the light emitting layer 330 may be formed by stacking a plurality of light emitting materials capable of generating different colors of light such as a red color of light, a green color of light, a blue color of light, etc, and may generate white light. In this case, a color filter may be disposed on the light emitting layer 330. The color filter may include at least one selected from a red color filter, a green color filter, and a blue color filter. In some implementations, the color filter may include a yellow color filter, a cyan color filter, and a magenta color filter. The color filter may include a photosensitive resin (or color photoresist), etc.

The upper electrode 340 may be disposed on the pixel defining layer 310 and the light emitting layer 330. The upper electrode 340 may include a metal, a metal alloy, metal nitride, conductive metal oxide, transparent conductive materials, etc. These may be used alone or in a suitable combination thereof. In some example embodiments, the upper electrode 340 may have a multi-layered structure.

The first thin film encapsulation (TFE) layer 451 may be disposed on the upper electrode 340. The first TFE layer 451 may cover the upper electrode 340, and may be disposed with a substantially uniform thickness along a profile of the upper electrode 340. The first TFE layer 451 may prevent the light emitting structure from being deteriorated by the permeation of moisture, water, oxygen, etc. In addition, the first TFE layer 451 may protect the light emitting structure from external impacts. The first TFE layer 451 may include inorganic materials.

The second TFE layer 452 may be disposed on the first TFE layer 451. The second TFE layer 452 may improve the flatness of the OLED device 100, and may protect the light emitting structure. The second TFE layer 452 may include organic materials.

The third TFE layer 453 may be disposed on the second TFE layer 452. The third TFE layer 453 may cover the second TFE layer 452, and may be disposed as a substantially uniform thickness along a profile of the second TFE layer 452. The third TFE layer 453 together with the first TFE layer 451 and the second TFE layer 452 may prevent the light emitting structure from being deteriorated by the permeation of moisture, water, oxygen, etc. In addition, the third TFE layer 453 together with the first TFE layer 451 and the second TFE layer 452 may protect the light emitting structure from external impacts. The third TFE layer 453 may include inorganic materials. Accordingly, the TFE structure 450 including the first TFE layer 451, the second TFE layer 452, and the third TFE layer 453 may be disposed. The display panel 200 including the substrate 110, the semiconductor element 250, the planarization layer 270, the lower electrode 290, the pixel defining layer 310, the light emitting layer 330, the upper electrode 340, and the TFE structure 450 may be disposed.

In some implementations, the TFE structure 450 may have a five layer structure where first to fifth TFE layers are stacked or may have a seven layer structure where the first to seventh TFE layers are stacked.

The touch screen electrode layer 410 may be disposed on the TFE structure 450 (or the display panel 200). The touch screen electrode layer 410 may include a bottom polyethylene terephthalate (PET) film, touch screen electrodes, and a top PET film, etc. The bottom PET film and the top PET film may protect the touch screen electrodes. For example, the top PET film and the bottom PET film may include polyethylene terephthalate (PET), polyethylene naphthalate (PEN), polypropylene (PP), polycarbonate (PC), polystyrene (PS), polysulfone (PSul), polyethyene (PE), polyphthalamide (PPA), polyethersulfone (PES), polyarylate (PAR), polycarbonate oxide (PCO), modified polyphenylene oxide (MPPO), etc. The touch screen electrodes may substantially have a metal mesh structure. For example, the touch screen electrodes may include carbon nanotube (CNT), transparent conductive oxide (TCO), indium tin oxide (ITO), indium gallium zinc oxide (IGZO), zinc oxide (ZnO), graphene, silver nanowire (AgNW), copper (Cu), chromium (Cr), etc. In some implementations, the touch screen electrodes may be disposed directly on the TFE structure 450. In this case, the bottom PET film may be omitted from the TFE structure 450.

The polarizing layer 430 may be disposed on the touch screen electrode layer 410. The polarizing layer 430 may include a linearly polarized film and a λ/4 phase retardation film. The λ/4 phase retardation film may be disposed on the touch screen electrode layer 410. The λ/4 phase retardation film may convert a phase of light. For example, the λ/4 phase retardation film may convert light vibrating up and down or light vibrating left and right into right-circularly polarized light or left-circularly polarized light, respectively. In addition, the λ/4 phase retardation film may convert right-circularly polarized light or left-circularly polarized light into light vibrating up and down or light vibrating left and right, respectively. The λ/4 phase retardation film may include a birefringent film containing a polymer, an orientation film of a liquid crystal polymer, an alignment layer of a liquid crystal polymer, etc.

The linearly polarized film may be disposed on the λ/4 phase retardation film. The linearly polarized film may selectively transmit incident light. For example, the linearly polarized film may transmit light vibrating up and down or vibrating left and right. In this case, the linearly polarized film may include a pattern of horizontal stripes or vertical stripes. When the linearly polarized film includes a pattern of horizontal stripes, the linearly polarized film may block light vibrating up and down, and may transmit light vibrating left and right. When the linearly polarized film includes a pattern of vertical stripes, the linearly polarized film may block light vibrating left and right, and may transmit light vibrating up and down.

Light passing through the linearly polarized film may pass through the λ/4 phase retardation film. As described above, the λ/4 phase retardation film may convert a phase of light. For example, when incident light vibrating up, down, left, and right passes through the linearly polarized film, the linearly polarized film including a pattern of the horizontal stripes may transmit light vibrating left and right. When incident light vibrating left and right passes through the λ/4 phase retardation film, incident light vibrating left and right may be converted into left-circularly polarized light. Incident light including the left-circularly polarized light may be reflected at the cathode electrode (e.g., the upper electrode 340) of the display panel 200, and then the incident light may be converted into right-circularly polarized light. When incident light including right-circularly polarized light passes through the λ/4 phase retardation film, the incident light may be converted into light vibrating up and down. The light vibrating up and down may be blocked by the linearly polarized film including a pattern of the horizontal stripes. Accordingly, incident light may be removed by the linearly polarized film and the λ/4 phase retardation film (i.e., the polarizing layer 430). The linearly polarized film may include, for example, iodine-based materials, materials containing dye, polyene-based materials, etc. Accordingly, the upper structure 400 including the touch screen electrode layer 410 and the polarizing layer 430 may be disposed.

In some implementations, the upper structure 400 includes the touch screen electrode layer 410 and the polarizing layer 430. In some implementations, the upper structure 400 may have a plurality of layers.

Referring again to FIGS. 2, 3, and 5, the lower protection film 300 may be disposed in a lower surface of the substrate 110. The lower protection film 300 may protect the display panel 200 from an external impact.

The lower protection film 300 may be disposed on a lower surface of the display panel 200 such that a portion of the bending region 50 is exposed. The lower protection film 300 may include a first lower protection film pattern 301 and a second lower protection film pattern 302 that is spaced apart form the first lower protection film pattern 301. In example embodiments, the first lower protection film pattern 301 may be disposed in the display region 10 and a portion of the bending region 50 that is located adjacent to the display region 10, and the second lower protection film pattern 302 may be disposed in the pad electrode region 60 and a portion of the bending region 50 that is located adjacent to the pad electrode region 60. The first lower protection film pattern 301 may include a first concave-convex pattern 315 in a portion of the bending region 50 that is located adjacent to the display region 10. The second lower protection film pattern 302 may include a second concave-convex pattern 325 in a portion of the bending region 50 that is located adjacent to the pad electrode region 60. The second concave-convex pattern 325 may have a shape that is insertable into the first concave-convex pattern 315. For example, the first concave-convex pattern 315 may be spaced apart from the second concave-convex pattern 325.

In example embodiments, the first concave-convex pattern 315 may include first convex portions 311 and first concave portions 312. The first convex portions 311 and the first concave portions 312 may be alternately arranged in a first direction D1 that is parallel to an upper surface of the lower protection film 300. The second concave-convex pattern 325 may include second convex portions 321 and second concave portions 322. The second convex portions 321 and the second concave portions 322 may be alternately arranged in the first direction D1. Each of the first convex portions 311 may face one of the second concave portions 322, and each of the first concave portions 312 may face one of the second convex portions 321.

As illustrated in FIG. 5, the first convex portion 311 may protrude in a fourth direction D4. The second concave portion 322 may include a recess toward a second direction D2 from the bending region 50. The second concave portion 322 may expose a lower surface of the display panel 200 that is located in the bending region 50. The lower protection film 300 may include PET, PEN, PP, PC, PS, PSul, PE, PPA, PES, PAR, PCO, MPPO, etc. In example embodiments, the lower protection film 300 may include PET.

As illustrated in FIG. 7, when the bending region 50 of the OLED device 100 is bent on an axis with respect to the first direction D1, the first convex portion 311 may be inserted into (or combined with) the second concave portion 322. For example, when the bending region 50 of the OLED device 100 is bent on an axis with respect to the first direction D1, an upper surface of the first convex portion 311 may be in direct contact with a lower surface of the display panel 200 located adjacent to the pad electrode region 60.

For example, when the bending region 50 is bent, the pad electrode region 60 may be located on a lower surface of the OLED device 100. In some implementations, the bending region 50 may be bent on an axis with respect to the first direction D1, and the second lower protection film pattern 302 may be disposed on a lower surface of the first lower protection film pattern 301. In some implementations, after the bending region 50 is bent, an adhesive tape may be interposed between the second lower protection film pattern 302 and the first lower protection film pattern 301. In this case, the second lower protection film pattern 302 and the first lower protection film pattern 301 may be fixed by the adhesive tape. In addition, the adhesive tape may absorb shock. The adhesive tape may include, for example, urethane, rubber, and/or the like.

In the OLED device 100 in accordance with example embodiments, when bending region 50 is bent on an axis with respect to the first direction D1, each of the first convex portions 311 may be inserted into a respective one of the second concave portions 322, and each of the second convex portions 321 may be inserted into a respective one of the first concave portion 312. Accordingly, a dead space may be reduced because a bending radius of curvature is relatively decreased. In addition, the OLED device 100 has a joining structure where the convex portions and the concave portions are combined. Accordingly, the bending region 50 of the OLED device 100 may have a strong joining structure that is not easily transformed by an external impact even when the bending region 50 is bent on an axis with respect to the first direction D1.

Figure 10:
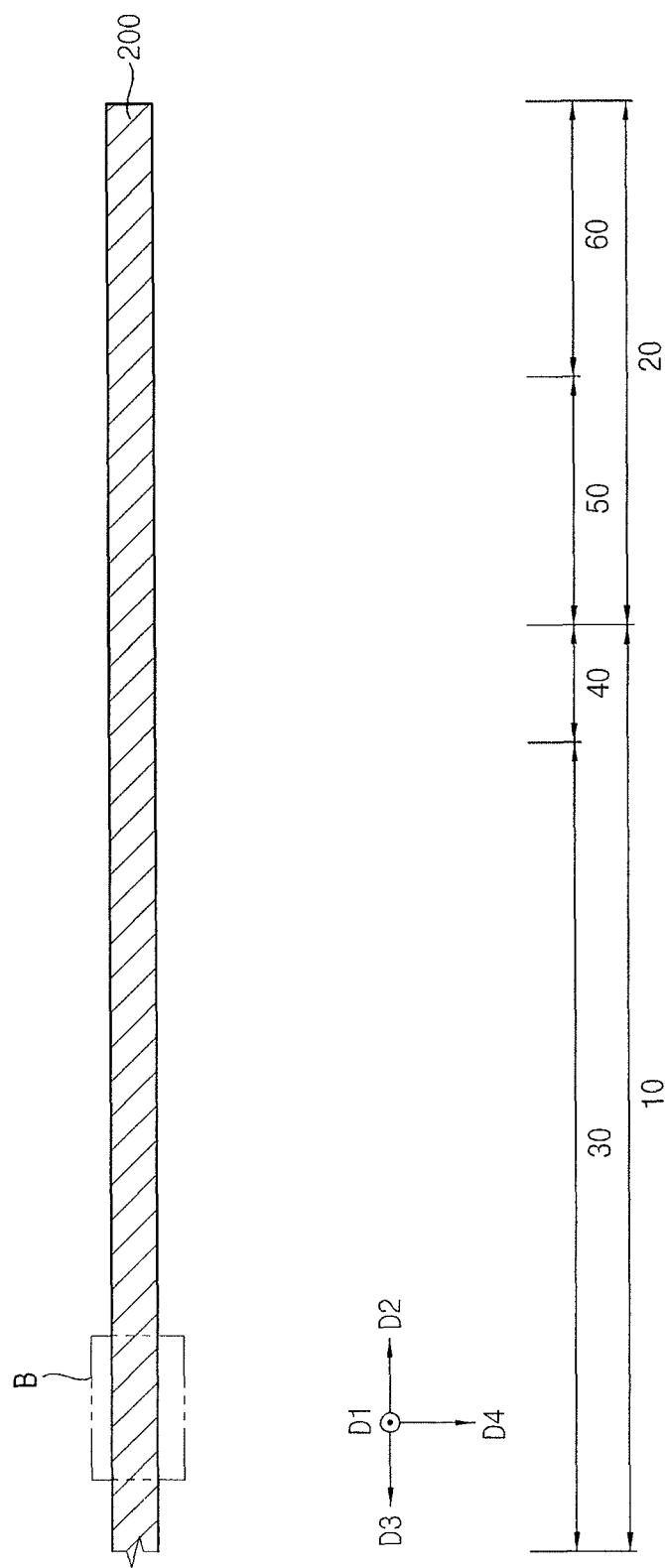
FIGS. 10 through 16 illustrate cross-sectional views of stages of a method of manufacturing an OLED device in accordance with example embodiments.
Figure 11:
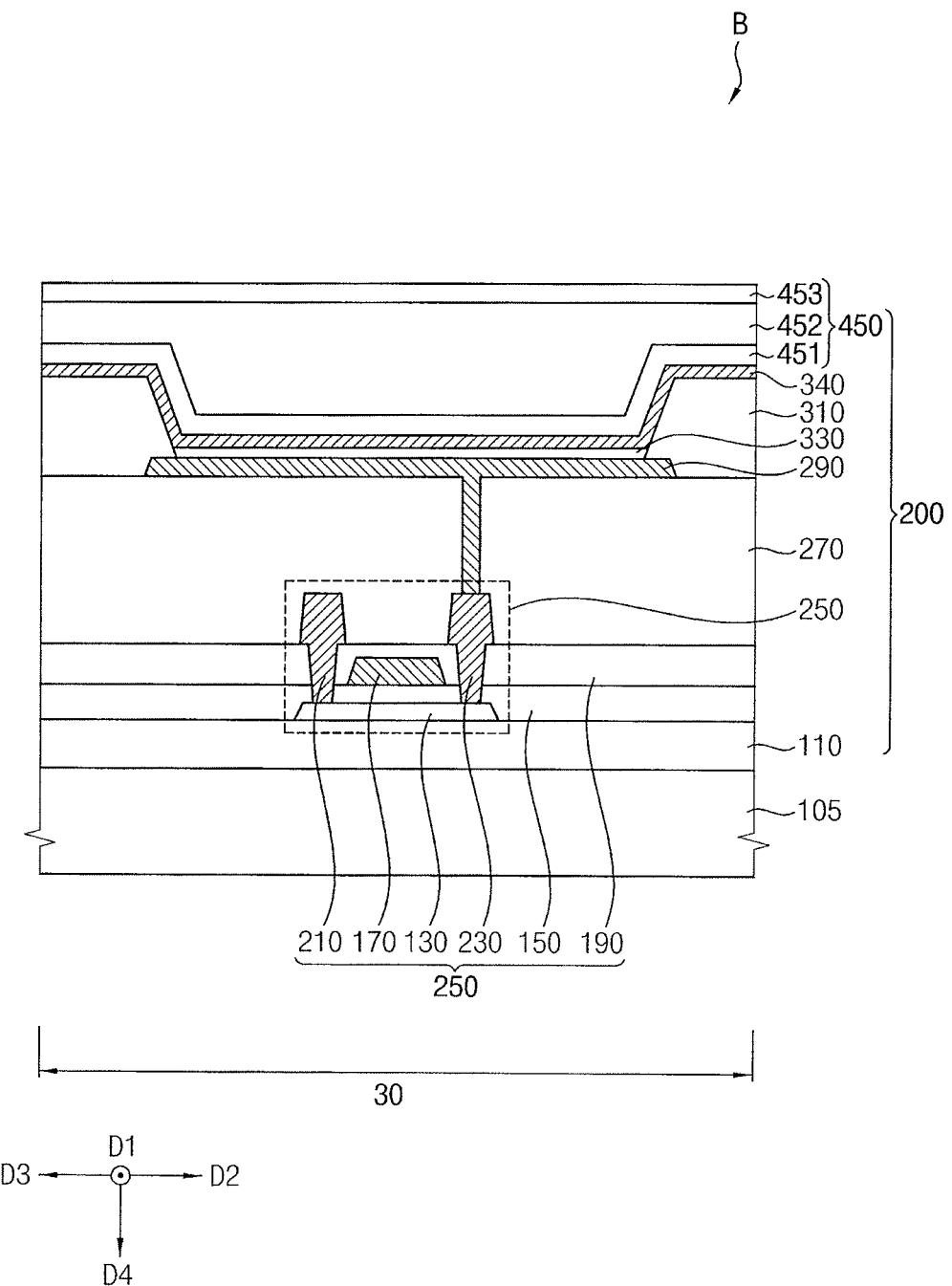

FIGS. 10 through 16 illustrate cross-sectional views of stages of a method of manufacturing an OLED device in accordance with example embodiments. FIG. 11 Illustrates an enlarged cross-sectional view corresponding to region 'B' of FIG. 10.

Referring to FIGS. 10 and 11, a display panel 200 may be provided. For example, the display panel 200 may be formed as described below.

As illustrated in FIG. 11, a substrate 110 including transparent materials or opaque materials may be formed on a glass substrate 105. The substrate 110 may be formed using a flexible transparent resin substrate.

A buffer layer may be formed on the substrate 110. The buffer layer may be formed on the entire substrate 110. The buffer layer may prevent the diffusion of metal atoms and/or impurities from the substrate 110. Additionally, the buffer layer may control a rate of a heat transfer in a crystallization process for forming an active layer, thereby allowing a substantially a uniform active layer to be formed. In addition, the buffer layer may improve a surface flatness of the substrate 110 in a case where a surface of the substrate 110 is relatively irregular. The buffer layer may be formed using silicon compound, metal oxide, etc.

An active layer 130 may be formed on the substrate 110. The active layer 130 may be formed using an oxide semiconductor, an inorganic semiconductor, an organic semiconductor, etc.

A gate insulation layer 150 may be formed to cover the active layer 130 and a portion of the substrate 110 not covered by the active layer. The gate insulation layer 150 may be formed using silicon compound, metal oxide, etc.

A gate electrode 170 may be formed on a portion of the gate insulation layer 150 under which the active layer 130 is located. The gate electrode 170 may be formed using a metal, a metal alloy, metal nitride, conductive metal oxide, transparent conductive materials, etc.

An insulating interlayer 190 may be formed on the gate electrode 170. The insulating interlayer 190 may cover the gate electrode 170 and a portion of the gate insulation layer 150 not covered by the gate electrode 170. The insulating interlayer 190 may be formed using a silicon compound, a metal oxide, etc.

A source electrode 210 and a drain electrode 230 may be formed on the insulating interlayer 190. The source electrode 210 may be in direct contact with a first side of the active layer 130 via a contact hole formed by removing a portion of the gate insulation layer 150 and the insulating interlayer 190. The drain electrode 230 may be in direct contact with a second side of the active layer 130 via a contact hole formed by removing another portion of the gate insulation layer 150 and the insulating interlayer 190. Each of the source electrode 210 and the drain electrode 230 may be formed using a metal, an alloy, metal nitride, conductive metal oxide, transparent conductive materials, etc. These may be used alone or in a suitable combination thereof. Accordingly, a semiconductor element 250 including the active layer 130, the gate insulation layer 150, the gate electrode 170, the insulating interlayer 190, the source electrode 210, and the drain electrode 230 may be formed.

A planarization layer 270 may be formed on the source electrode 210 and the drain electrode 230. The planarization layer 270 may cover the source electrode 210 and the drain electrode 230, and may be formed on the entire insulating interlayer 190. In example embodiments, the planarization layer 270 may be formed with sufficient thickness to cover the source and drain electrodes 210 and 230. In this case, the planarization layer 270 may have a substantially flat upper surface. A planarization process may be performed on the planarization layer 270 to provide the flat upper surface of the planarization layer 270. The planarization layer 270 may be formed using organic materials.

A lower electrode 290 may be formed on the planarization layer 270. The lower electrode 290 may be in contact with the drain electrode 230 via a contact hole formed by removing a portion of the planarization layer 270. The lower electrode 290 may be formed using a metal, a metal alloy, metal nitride, conductive metal oxide, transparent conductive materials, etc. These may be used alone or in a suitable combination thereof.

A pixel defining layer 310 may be formed on the planarization layer 270, and may expose a portion of the lower electrode 290. The pixel defining layer 310 may be formed using organic materials.

A light emitting layer 330 may be formed on a portion of the lower electrode 290 exposed by the pixel defining layer 310. The light emitting layer 330 may be formed using at least one of light emitting materials capable of generating different colors of light (e.g., a red color of light, a blue color of light, and a green color of light, etc.) according to sub-pixels. In some implementations, the light emitting layer 330 maybe formed by stacking a plurality of light emitting materials capable of generating different colors of light such as a red color of light, a green color of light, a blue color of light, etc, and may generate a while color of light. In this case, a color filter may be disposed on the light emitting layer 330. The color filter may include at least one selected from a red color filter, a green color filter, and a blue color filter. In some implementations, the color filter may include a yellow color filter, a cyan color filter, and a magenta color filter. The color filter may be formed using a photosensitive resin, etc.

An upper electrode 340 may be formed on the pixel defining layer 310 and the light emitting layer 330. The upper electrode 340 may be formed using a metal, a metal alloy, metal nitride, conductive metal oxide, transparent conductive materials, etc. These may be used alone or in a suitable combination thereof.

A first TFE layer 451 may be formed on the upper electrode 340. The first TFE layer 451 may cover the upper electrode 340, and may be formed as a substantially uniform thickness along a profile of the upper electrode 340. The first TFE layer 451 may prevent a light emitting structure (e.g., the lower electrode 290, the light emitting layer 330, the upper electrode 340, etc.) from being deteriorated by the permeation of moisture, water, oxygen, etc. In addition, the first TFE layer 451 may protect the light emitting structure from external impacts. The first TFE layer 451 may be formed using inorganic materials having a flexibility.

A second TFE layer 452 may be formed on the first TFE layer 451. The second TFE layer 452 may improve the flatness of an OLED device, and may protect the light emitting structure. The second TFE layer 452 may be formed using organic materials having a flexibility.

A third TFE layer 453 may be formed on the second TFE layer 452. The third TFE layer 453 may cover the second TFE layer 452, and may be formed with a substantially uniform thickness along a profile of the second TFE layer 452. The third TFE layer 453 together with the first TFE layer 451 and the second TFE layer 452 may prevent the light emitting structure from being deteriorated by the permeation of moisture, water, oxygen, etc. In addition, the third TFE layer 453 together with the first TFE layer 451 and the second TFE layer 452 may protect the light emitting structure from external impacts. The third TFE layer 453 may be formed using inorganic materials having a flexibility. Accordingly, a TFE structure 450 including the first TFE layer 451, the second TFE layer 452, and the third TFE layer 453 may be formed.

After the semiconductor element 250, the planarization layer 270, the lower electrode 290, the pixel defining layer 310, the light emitting layer 330, the upper electrode 340, and the TFE structure 450 are formed, the glass substrate 105 may be removed. Accordingly, a display panel 200 including the substrate 110, the semiconductor element 250, the planarization layer 270, the lower electrode 290, the pixel defining layer 310, the light emitting layer 330, the upper electrode 340, and the TFE structure 450 may be formed.

Figure 12:
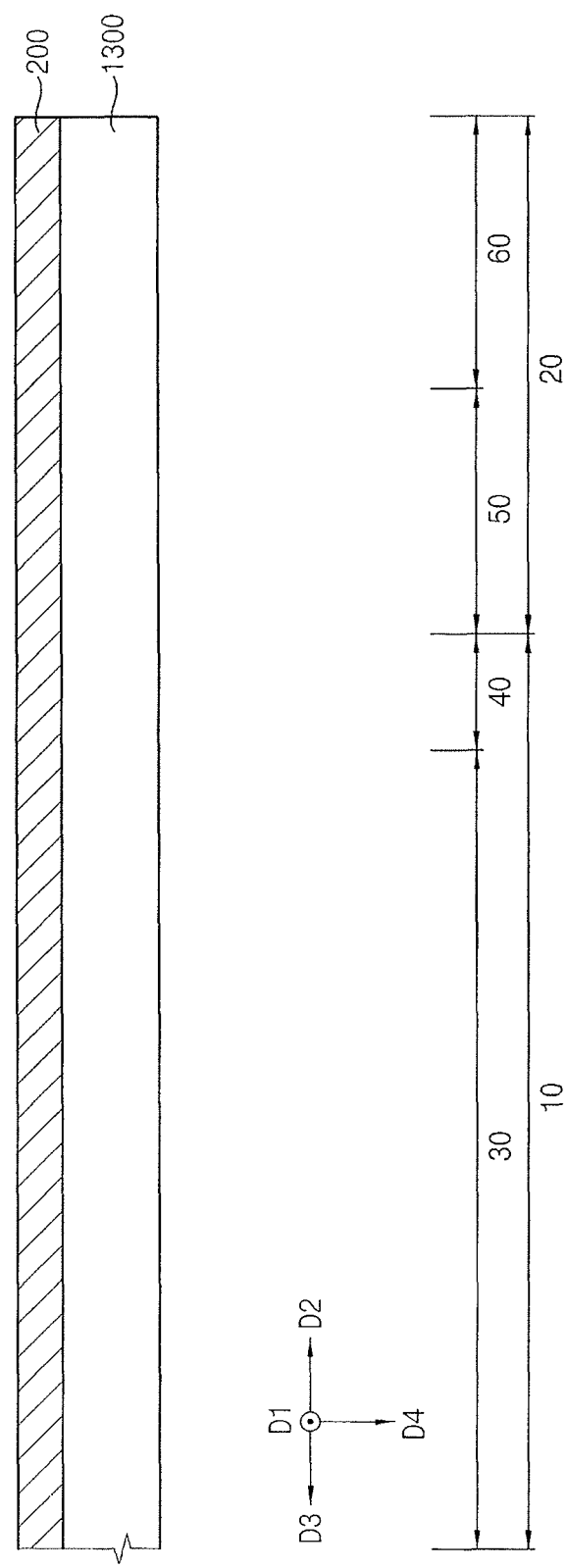

Referring to FIG. 12, a preliminary lower protection film 1300 may be formed on a lower surface of the entire display panel 200. The preliminary lower protection film 1300 may protect the display panel 200 from an external impact. The preliminary lower protection film 1300 may be formed using PET, PEN, PP, PC, PS, PSul, PE, PPA, PES, PAR, PCO, MPPO, etc. In example embodiments, the preliminary lower protection film 1300 may include PET.

Figure 13:
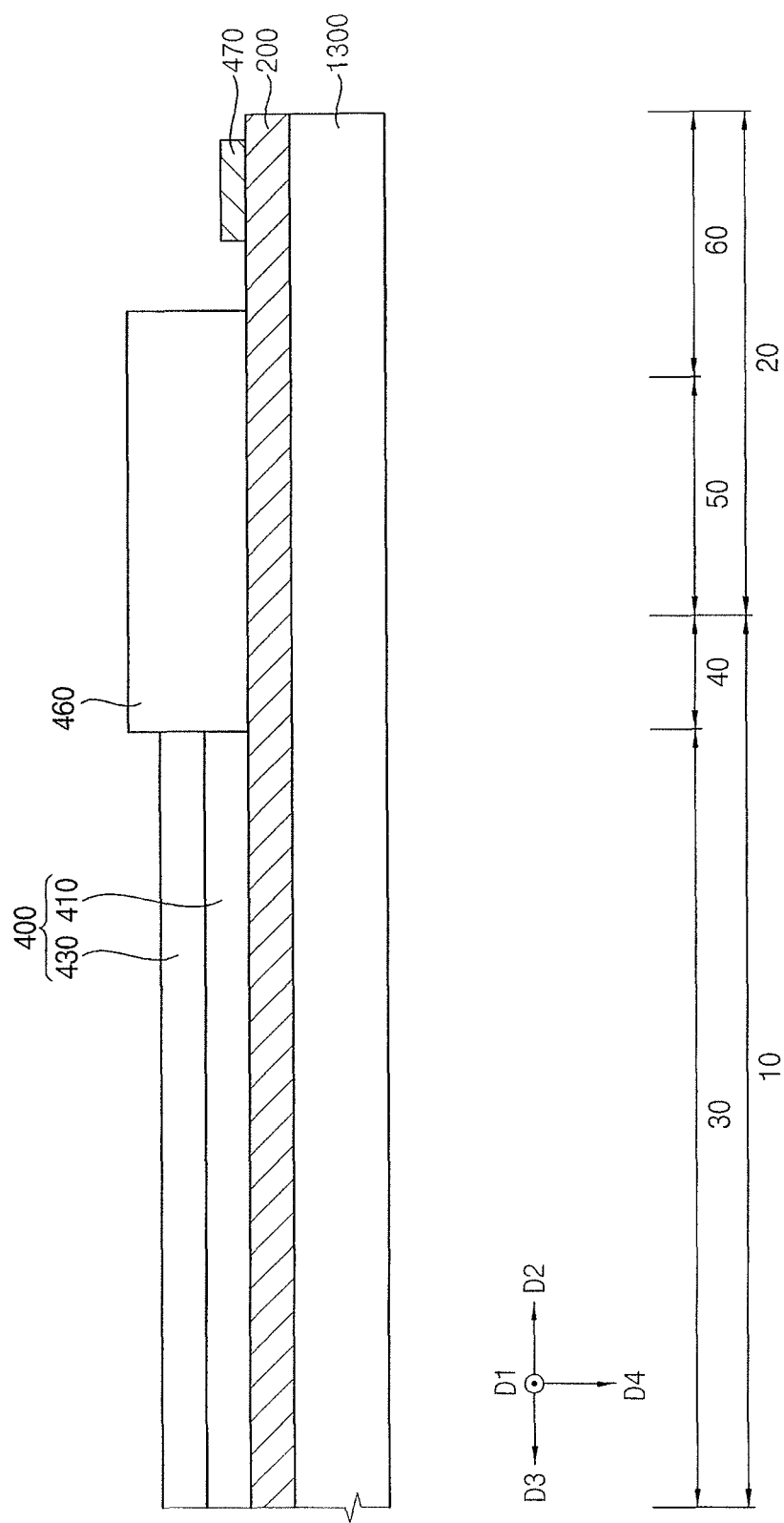

Referring to FIG. 13, a touch screen electrode layer 410 may be formed on the display panel 200. The touch screen electrode layer 410 may include a bottom PET film, touch screen electrodes, and a top PET film, etc. The bottom PET film and the top PET film may protect the touch screen electrodes. The touch screen electrodes may substantially have a metal mesh structure. In some implementations, the touch screen electrodes may be formed directly on the TFE structure 450. In this case, the bottom PET film may be omitted from the TFE structure 450.

A polarizing layer 430 may be disposed on the touch screen electrode layer 410. The polarizing layer 430 may include a linearly polarized film and a λ/4 phase retardation film. The λ/4 phase retardation film may be formed on the touch screen electrode layer 410. The λ/4 phase retardation film may convert a phase of light. The λ/4 phase retardation film may be formed using a birefringent film containing polymer, an orientation film of a liquid crystal polymer, alignment layer of a liquid crystal polymer, etc.

The linearly polarized film may be formed on the λ/4 phase retardation film. The linearly polarized film may selectively transmit incident light. For example, the linearly polarized film may be formed using iodine-based materials, materials containing dye, polyene-based materials, etc. Accordingly, an upper structure 400 including the touch screen electrode layer 410 and the polarizing layer 430 may be formed.

A pad electrode 470 may be formed in a pad region 20, and the pad electrode 470 may be electrically connected to an external device. For example, the pad electrode 470 may be electrically connected to the external device through a FPCB. The pad electrode 470 may be formed using a metal, an alloy of a metal, etc.

A bending protection layer 460 may be formed in a portion of a display region 10, a bending region 50, and a portion of a pad electrode region 60 on the display panel 200. In example embodiments, connection electrodes formed in the bending region 50 of the display panel 200 may be formed under the bending protection layer 460. The connection electrodes may electrically connect wirings disposed in a peripheral region 40 and the pad electrode 470. The bending protection layer 460 may protect the connection electrodes, and may raise a neutral plane of the bending region 50 in a direction that is opposite to a fourth direction D4. For example, when the bending region 50 is bent, breaking of the connection electrodes may be prevented because the neutral plane of the bending region 50 is located within the portion where the connection electrodes are disposed (or on the connection electrodes). The bending protection layer 460 may be formed using organic materials.

Figure 14:
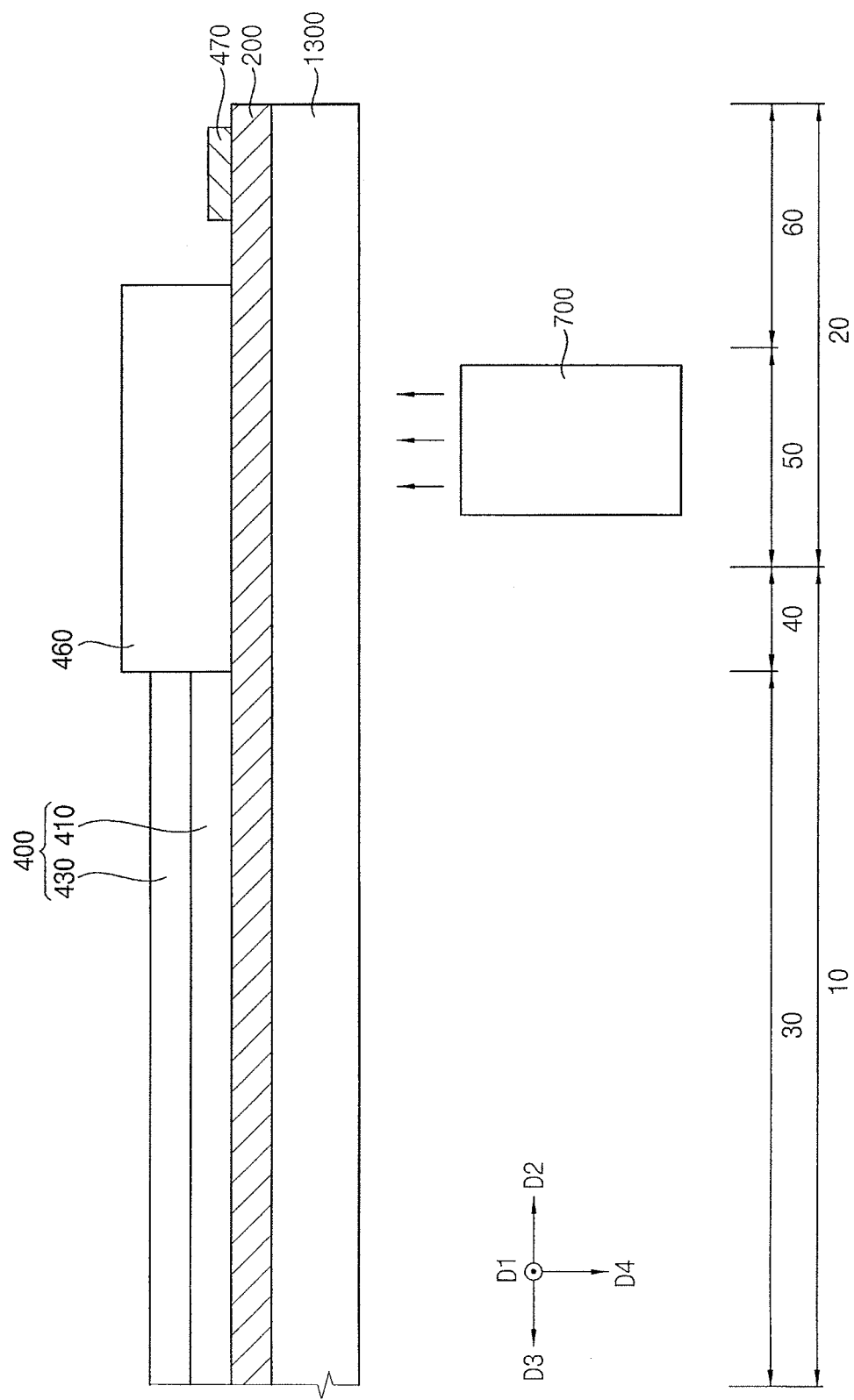
Figure 15:
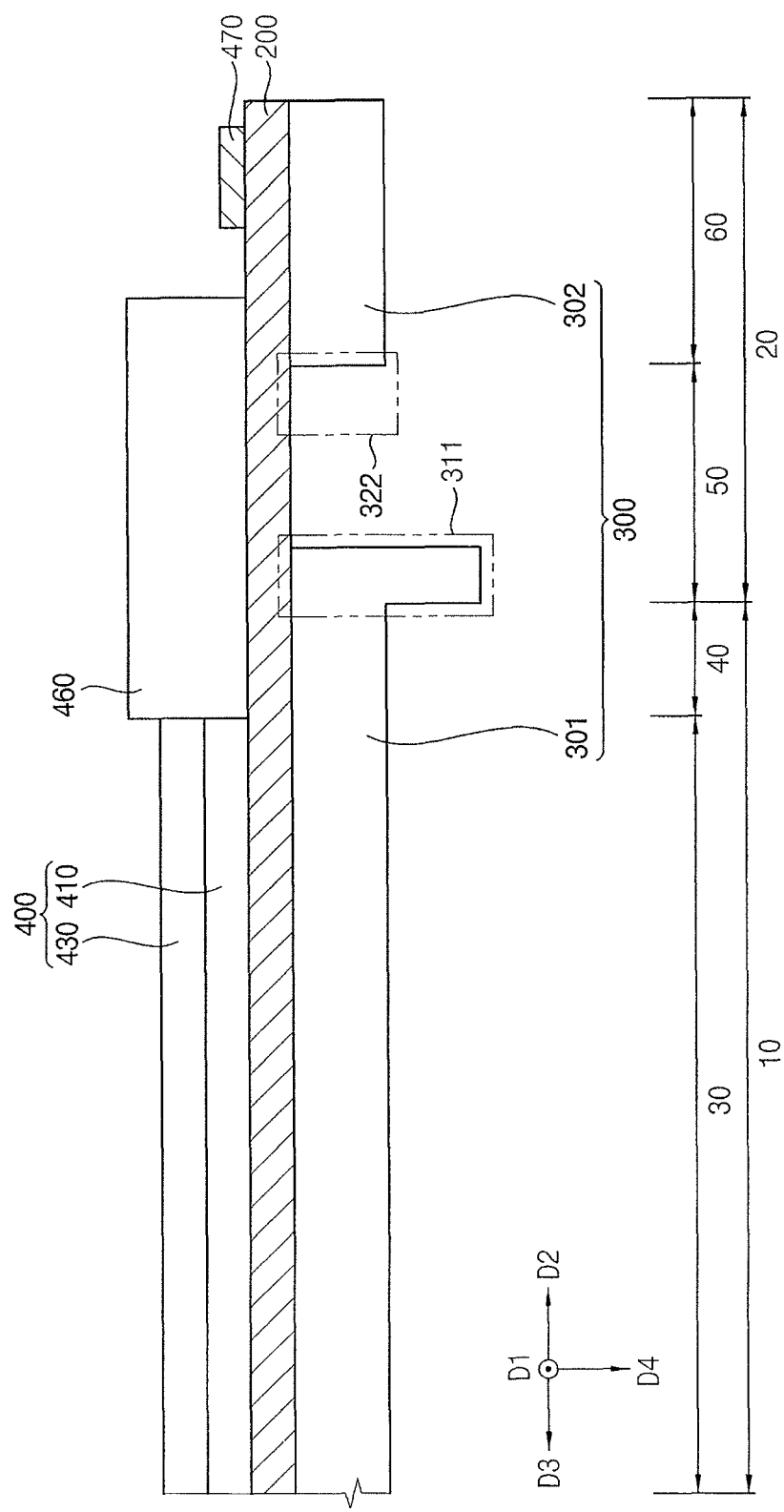

Referring to FIGS. 14 and 15, a heat block 700 may be positioned in the bending region 50 on a lower surface of the preliminary lower protection film 1300. After the heat block 700 is positioned in the bending region 50, the heat block 700 may be in contact with the lower surface of the preliminary lower protection film 1300. In this case, the heat block 700 may heat the preliminary lower protection film 1300 located in the bending region 50 at a predetermined temperature (e.g., 400 degrees or less), and the preliminary lower protection film 1300 located in the bending region 50 may be removed. In example embodiments, after a heat process of the heat block 700 is performed, the preliminary lower protection film 1300 may become the lower protection film 300. The lower protection film 300 may include a first lower protection film pattern 301 having a first concave-convex pattern 315 and a second lower protection film pattern 302 having a second concave-convex pattern 325. For example, a shape of the heat block 700 may be determined such that the first lower protection film pattern 301 and the first concave-convex pattern 315 are formed in the preliminary lower protection film 1300.

For example, a conventional heat block has a plan shape of a bar. If a conventional heat block were to be used of remove a portion of the preliminary lower protection film, a step (or a bump) might be formed on the lower protection film adjacent to the bending region when the preliminary lower protection film is removed in the bending region using the conventional heat block.

In example embodiments, the heat block 700 may have a concave-convex structure, such that the first concave-convex pattern 315 and the second concave-convex pattern 325 illustrated in FIGS. 2 and 3 may be formed in the portion of the lower protection film 300 in the bending region 50 when the heat block 700 is removed. For example, a recess (e.g., the first concave portion 312 and the second concave portion 322) may be formed in the step by using the heat block 700. Accordingly, the lower protection film 300 illustrated in FIG. 15 may be formed.

The lower protection film 300 may be formed on a lower surface of the display panel 200 such that a portion of the bending region 50 is exposed. The lower protection film 300 may include the first lower protection film pattern 301 and the second lower protection film pattern 302, the second lower protection film pattern 302 being spaced apart form the first lower protection film pattern 301. In example embodiments, the first lower protection film pattern 301 may be formed in the display region 10 and in a portion of the bending region 50 that is located adjacent to the display region 10, and the second lower protection film pattern 302 may be formed in the pad electrode region 60 and in a portion of the bending region 50 that is located adjacent to the pad electrode region 60. The first lower protection film pattern 301 may include a first concave-convex pattern 315 in a portion of the bending region 50 that is located adjacent to the display region 10, and the second lower protection film pattern 302 may include a second concave-convex pattern 325 in a portion of the bending region 50 that is located adjacent to the pad electrode region 60. The first concave-convex pattern 315 may be spaced apart from the second concave-convex pattern 325. The second concave-convex pattern 325 may have a shape such that the second concave-convex pattern 325 is insertable into the first concave-convex pattern 315.

In example embodiments, as illustrated in FIGS. 2 and 3, the first concave-convex pattern 315 may include first convex portions 311 and first concave portions 312. The first convex portions 311 and the first concave portions 312 may be alternately arranged in the first direction D1 that is parallel to an upper surface of the lower protection film 300. In addition, the second concave-convex pattern 325 may include second convex portions 321 and second concave portions 322. T the second convex portions 321 and the second concave portions 322 may be alternately arranged in the first direction D1. Each of the first convex portions 311 may face a respective one of the second concave portions 322, and each of the first concave portions 312 may face a respective one of the second convex portions 321. The lower protection film 300 may have a zipper shape in the bending region 50 when viewed in a plan view of an OLED device. For example, a shape of each of the first convex portions 311, the first concave portions 312, the second convex portions 321, and the second concave portions 322 may have a plan shape of a tetragon. The first convex portion 311 may protrude in a second direction D2 that is perpendicular to the first direction D1, and the second convex portion 321 may protrude in a third direction D3 that is opposite to the second direction D2. Each of the first convex portion 311 and the second convex portion 321 may protrude in a fourth direction D4 that is vertical to the first direction DI, in the second direction D2, and in the third direction D3. In example embodiments, the first concave portion 312 may include a recess toward the third direction D3 from the bending region 50, and the second concave portion 322 may include a recess toward the second direction D2 from the bending region 50. In addition, each of the first concave portion 312 and the second concave portion 322 may expose a lower surface of the display panel 200 that is located in the bending region 50.

Figure 16:
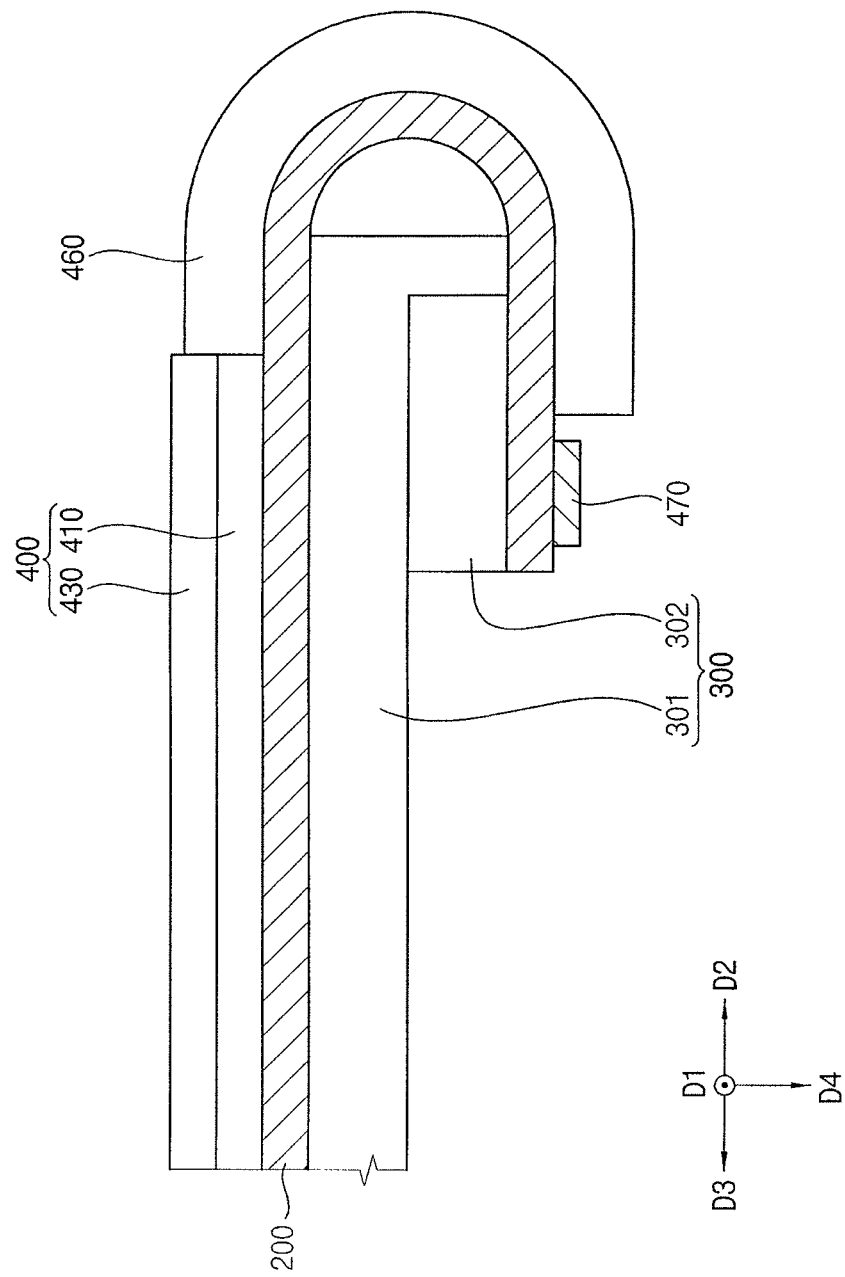

Referring to FIG. 16, when the bending region 50 of an OLED device 100 is bent on an axis with respect to the first direction D1, each of the first convex portions 311 may be inserted into each of the second concave portions 322, and each of the second convex portions 321 may be inserted into each of the first concave portion 312. For example, when the bending region 50 of the OLED device 100 is bent on an axis with respect to the first direction D1, an upper surface of the first convex portion 311 may be in direct contact with a lower surface of the display panel 200 located adjacent to the pad electrode region 60, and an upper surface of the second convex portion 321 may be in direct contact with a lower surface of the display panel 200 located adjacent to the display region 10. Accordingly, the OLED device 100 illustrated FIG. 16 may be manufactured.

Figure 17:
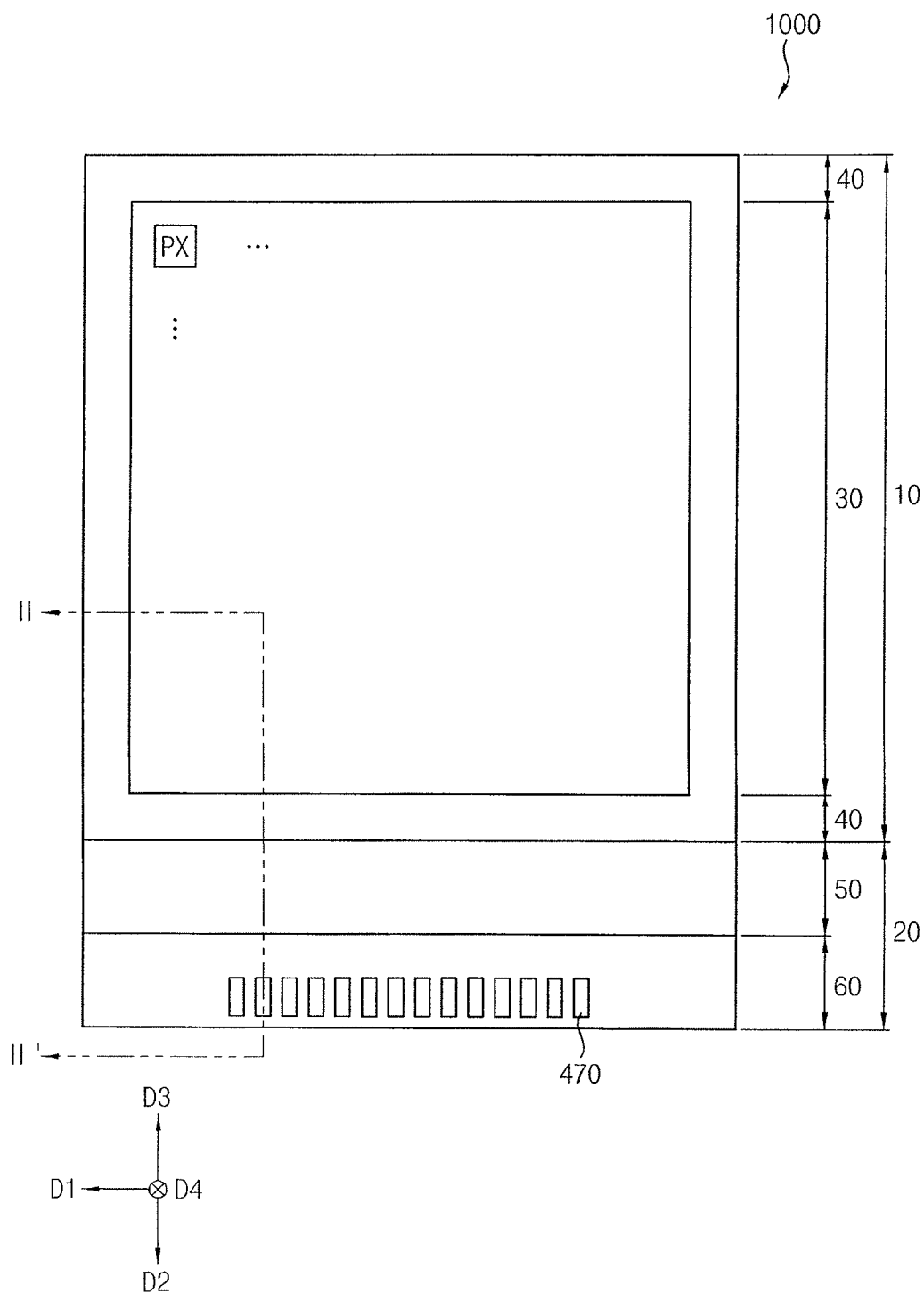
FIG. 17 illustrates a cross-sectional view of an OLED device in accordance with example embodiments.
Figure 18:
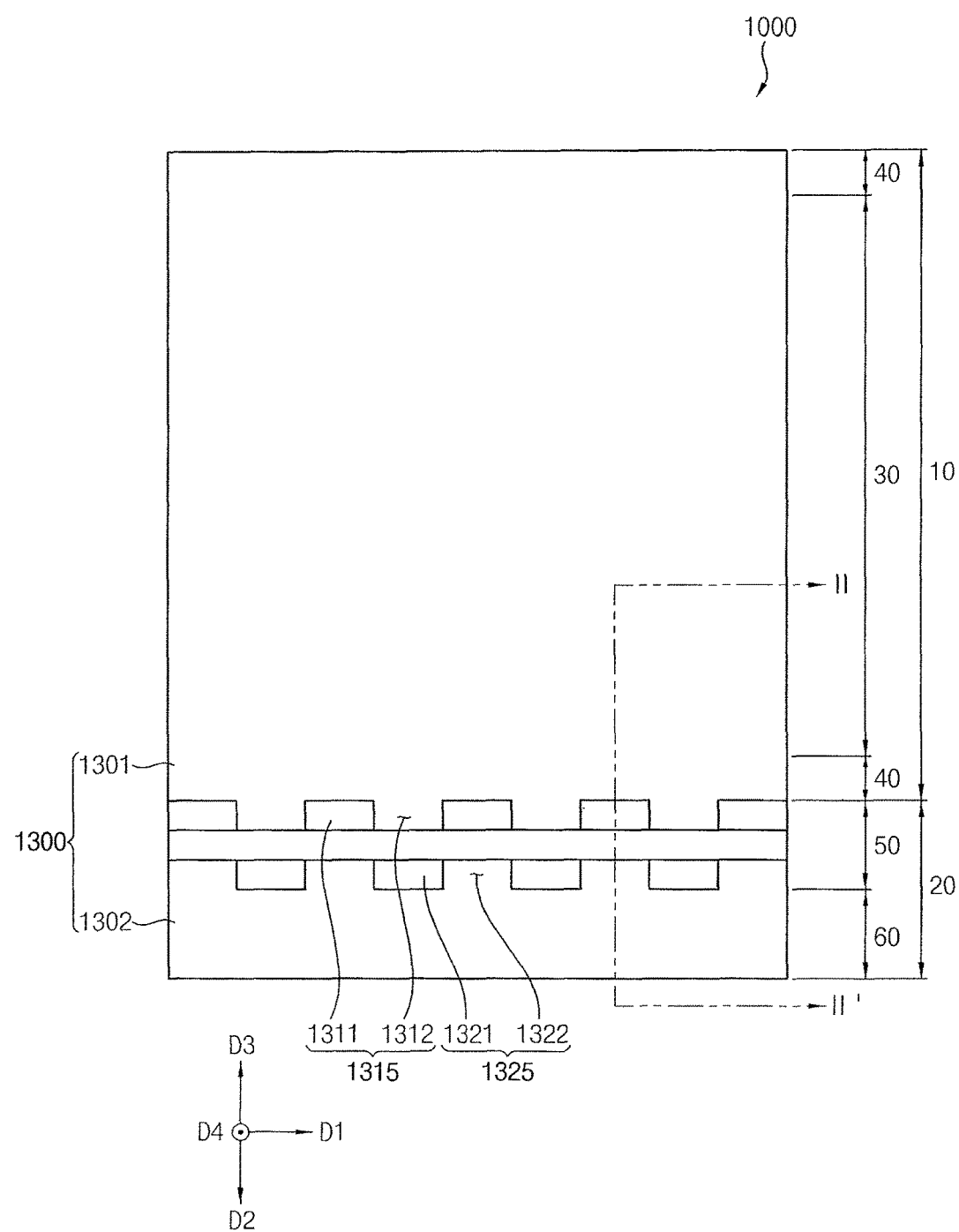
FIG. 18 illustrates a plan view of a lower surface of the OLED device of FIG. 17.
Figure 19:
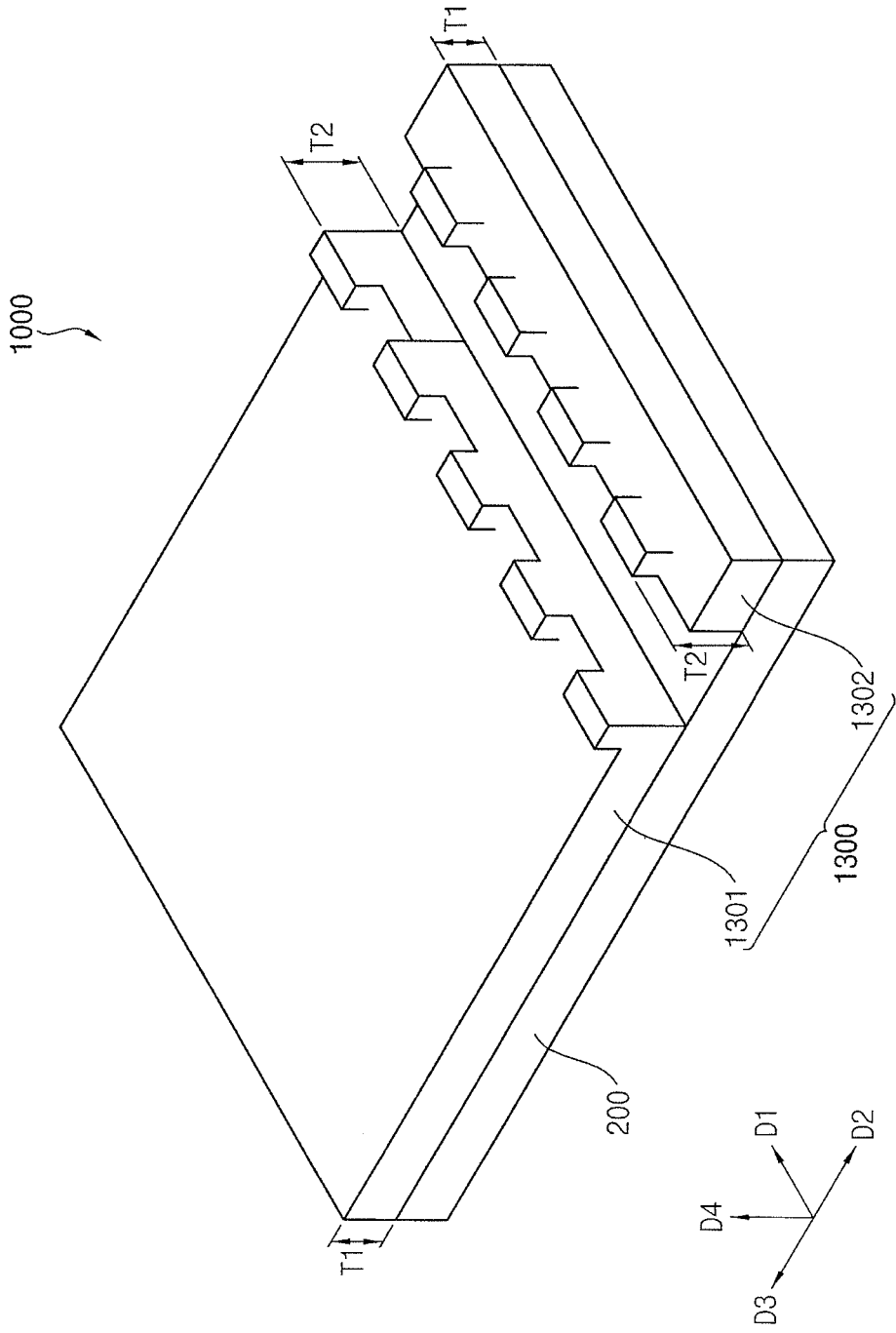
FIG. 19 illustrates a perspective view of a lower surface of the OLED device of FIG. 17.

FIG. 17 illustrates a cross-sectional view of an OLED device in accordance with example embodiments, and FIG. 18 illustrates a plan view of a lower surface of the OLED device of FIG. 17. FIG. 19 illustrates a perspective view or a lower surface of the OLED device of FIG. 17. An OLED device 1000 illustrated in FIGS. 17, 18, and 19 may have a configuration substantially the same as or similar to that of an OLED device 100 described with reference to FIGS. 1, 2, and 3 except a difference in a shape of a lower protection film 1300. In FIGS. 17, 18, and 19, detailed descriptions for elements that are substantially the same as or similar to elements described with reference to FIGS. 1, 2, and 3 will not be repeated.

Referring, to FIGS. 17, 18, and 19, a lower protection film 1300 may be disposed on a lower surface of a display panel 200 such that a portion of a bending region 50 is exposed. The lower protection film 1300 may include a first lower protection film pattern 1301 and a second lower protection film pattern 1302, the second lower protection film pattern 1302 being spaced apart form the first lower protection film pattern 1301. In example embodiments, the lower protection film 1300 may be in direct contact with a lower surface of the display panel 200. The first lower protection film pattern 1301 may be disposed in a display region 10 and in a portion of the bending region 50 that is located adjacent to the display region 10. The second lower protection film pattern 1302 may be disposed in a pad electrode region 60 and in a portion of the bending region 50 that is located adjacent to the pad electrode region 60. The first lower protection film pattern 1301 may include a first concave-convex pattern 1315 in a portion of the bending region 50 that is located adjacent to the display region 10, and the second lower protection film pattern 1302 may include a second concave-convex pattern 1325 in a portion of the bending region 50 that is located adjacent to the pad electrode region 60. The first concave-convex pattern 1315 may be spaced apart from the second concave-convex pattern 1325. The second concave-convex pattern 1325 may have a shape such that the second concave-convex pattern 1325 is insertable into the first concave-convex pattern 1315.

In example embodiments, the first concave-convex pattern 1315 may include first convex portions 1311 and first concave portions 1312. The first convex portions 1311 and the first concave portions 1312 may be alternately arranged in a first direction D1 that is parallel to an upper surface of the lower protection film 1300. The second concave-convex pattern 1325 may include second convex portions 1321 and second concave portions 1322. The second convex portions 1321 and the second concave portions 1322 may be alternately arranged in the first direction D1. Each of the first convex portions 1311 may face a respective one of the second concave portions 1322, and each of the first concave portions 1312 may face a respective one of the second convex portions 1321. For example, the number of the first convex portions 1311 may be the same as the number of the second concave portions 1322, and the number of second convex portions 1321 may be the same as the number of the first concave portions 1312. As illustrated in FIG. 18, the lower protection film 1300 may have a zipper shape in the bending region 50 when viewed in a plan view of the OLED device 1000. For example, a shape of each of the first convex portions 1311, the first concave portions 1312, the second convex portions 1321, and the second concave portions 1322 may have a plan shape of a tetragon.

In example embodiments, as illustrated in FIGS. 18 and 19, the first convex portion 1311 may protrude in a fourth direction D4 from an upper surface of the first lower protection film pattern 1301, and the second convex portion 1321 may protrude in the fourth direction D4 from an upper surface of the second lower protection film pattern 1302.

In example embodiments, illustrated in FIGS. 18 and 19, the first concave portion 1312 may include a recess toward a third direction D3 from the bending region 50, and the second concave portion 1322 may include a recess toward a second direction D2 from the bending region 50. Each of the first concave portion 1312 and the second concave portion 1322 may expose a lower surface of the display panel 200 that is located in the bending region 50.

Accordingly, when the bending region 50 of the OLED device 1000 is bent on an axis with respect to the first direction D1, each of the first convex portions 1311 may be inserted into each of the second concave portions 1322, and each of the second convex portions 1321 may be inserted into each of the first concave portion 1312. For example, when the bending region 50 of the OLED device 1000 is bent on an axis with respect to the first direction D1, an upper surface of the first convex portion 1311 may be in direct contact with a lower surface of the second lower protection film pattern 1302 located to the bending region 50, and an upper surface of the second convex portion 1321 may be in direct contact with a lower surface of the first lower protection film pattern 1301 located to the bending region 50.

For example, the first concave-convex pattern 1315 may include adjacent two first convex portions 1311 and one first concave portion 1312 that is located between the adjacent two first convex portion 1311. The second concave-convex pattern 1325 may include adjacent two second concave portions 1322 and one second convex portion 1321 located between the adjacent two second concave portion 1322. The adjacent two first convex portions 1311 may face the adjacent two second concave portions 1322, and the second convex portion 1321 may face the second concave portion 1322. Each of the first convex portions 1311 and the second convex portions 1321 may protrude in a direction that is vertical to the lower protection film 1300 (e.g., the fourth direction D4). Further, a first empty space that is located between the adjacent two first convex portions 1311 may be defined as the first concave portion 1312, and second and third empty spaces that are located in both lateral portions of the second convex portion 1321 may be defined as the second concave portions 1322. In example embodiments, each of the first lower protection film pattern 1301 and the second lower protection film pattern 1302 may have a first thickness T1 in a portion except for where the first and second convex portions 1311 and 1321 are located, and may have a second thickness T2 a portion the first and second convex portions 1311 and 1321 are located.

Figure 20:
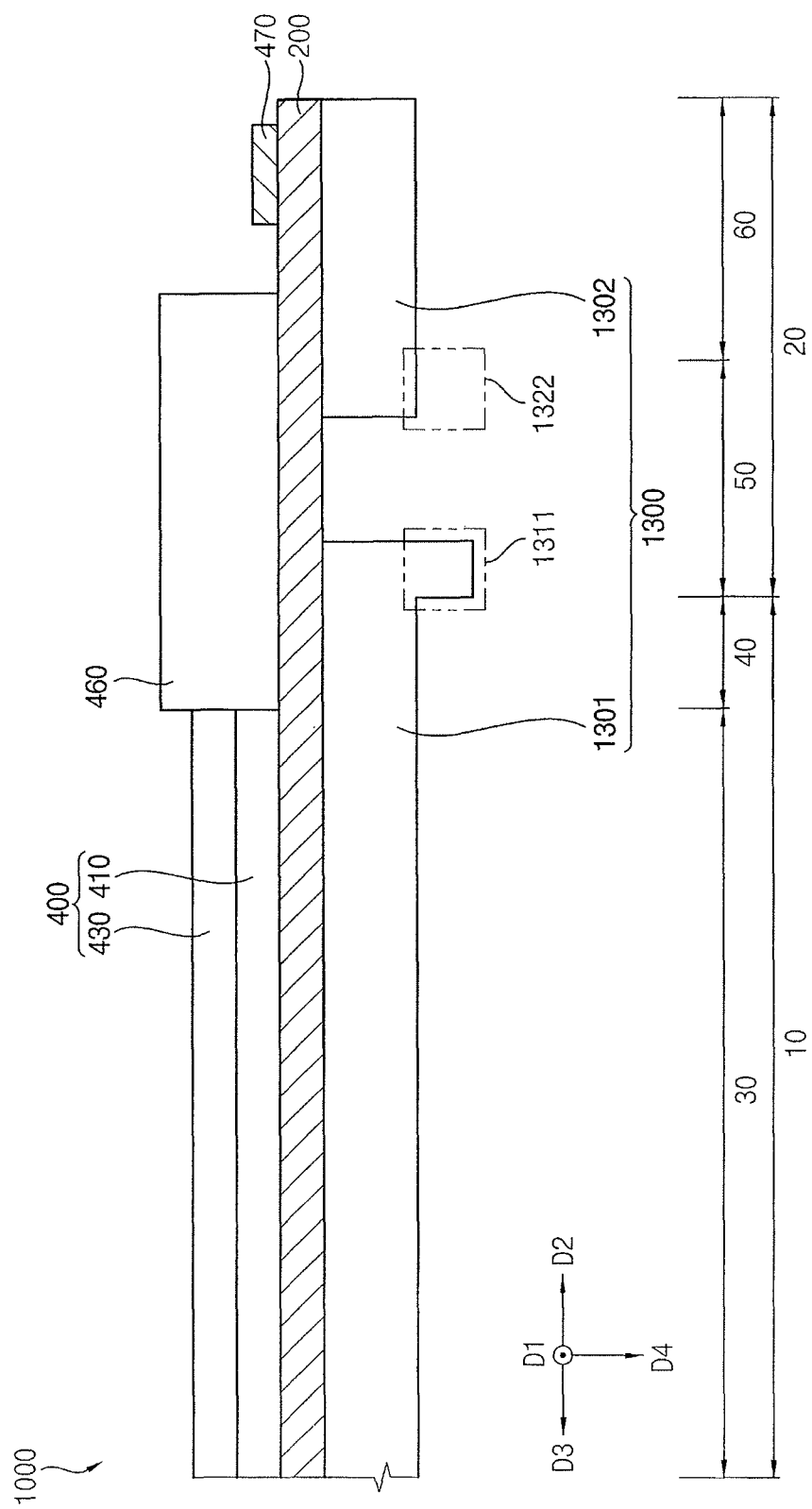
FIG. 20 illustrates a cross-sectional view taken along a line II-II' of FIGS. 17 and 18.
Figure 21:
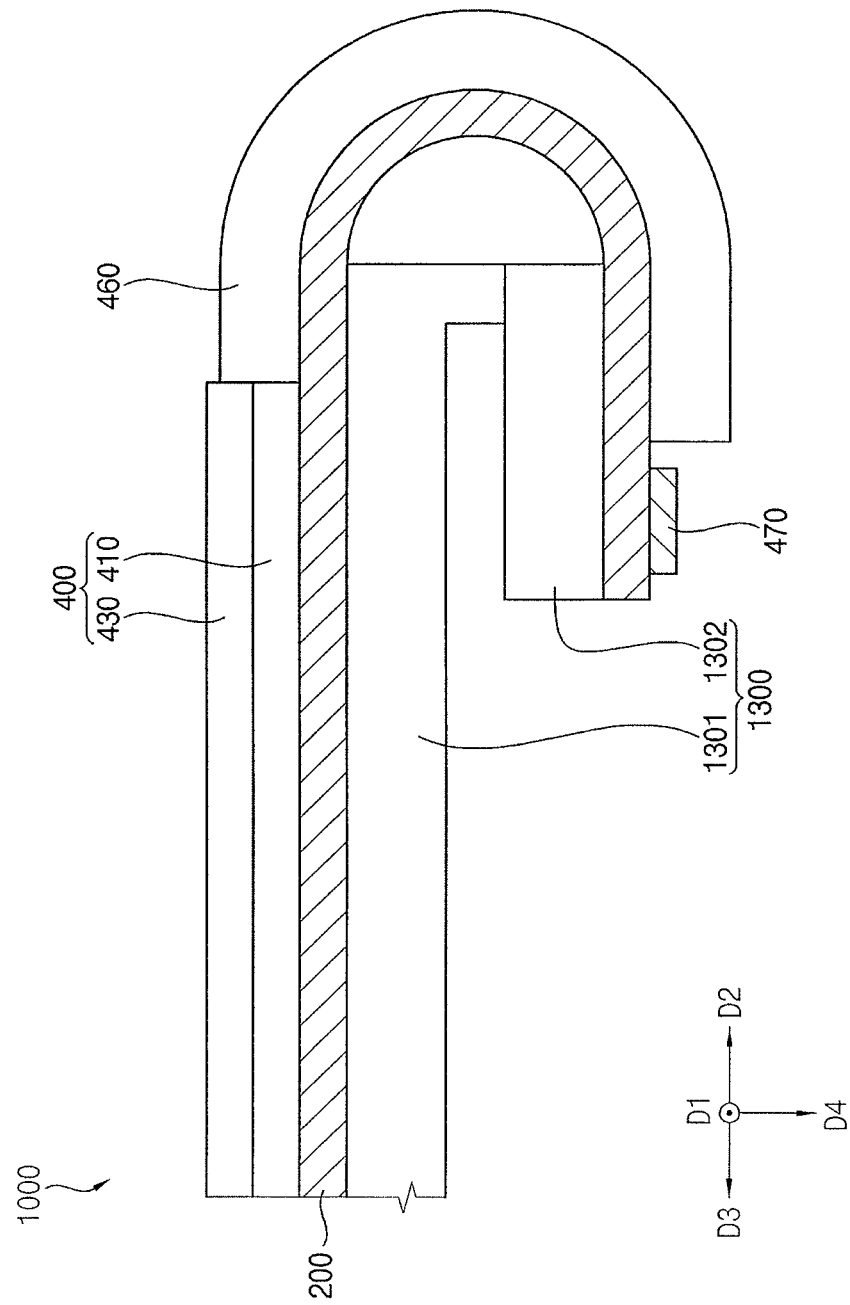
FIG. 21 illustrates a cross-sectional view for describing a bent shape of the OLED device of FIG. 20.

FIG. 20 illustrates a cross-sectional view taken along a line II-II' of FIGS. 17 and 18, and FIG. 21 illustrates a cross-sectional view for describing a bent shape of the OLED device of FIG. 20.

An OLED device 1000 illustrated in FIGS. 20 and 21 may have a configuration substantially the same as or similar to that of an OLED device 100 described with reference to FIGS. 5 and 7 except for a difference in a shape of a lower protection film 1300. In FIGS. 20 and 21 detailed descriptions for elements that are substantially the same as or similar to elements described with reference to FIGS. 5 and 7 will not be repeated.

Referring to FIGS. 20 and 21, the OLED device 1000 may include a display panel 200, a lower protection film 1300, an upper structure 400, a bending protection layer 460, a pad electrode 470, etc. The lower protection film 1300 may include a first lower protection film pattern 1301 and a second lower protection film pattern 1302. In addition, the upper structure 400 may include a polarizing layer 430 and a touch screen electrode layer 410.

The lower protection film 1300 may be disposed on a lower surface of the display panel 200. In example embodiments, the lower protection film 1300 may include a first lower protection film pattern 1301 and a second lower protection film pattern 1302. The first lower protection film pattern 1301 may be disposed in the display region 10 and in a portion of the bending region 50 that is located adjacent to the display region 10. The second lower protection film pattern 1302 may be disposed in the pad electrode region 60 and in a portion of the bending region 50 located adjacent to the pad electrode region 60. The first lower protection film pattern 1301 and the second lower protection film pattern 1302 may be spaced apart from each other in the bending region 50. The lower protection film 1300 may expose a portion of the bending region 50. The lower protection film 1300 may expose a lower surface of the display panel 200 in the bending region 50.

The first lower protection film pattern 1301 may include a first concave-convex pattern 1315 in a portion of the bending region 50 that is located adjacent to the display region 10, and the second lower protection film pattern 1302 may include a second concave-convex pattern 1325 in a portion of the bending region 50 that is located adjacent to the pad electrode region 60. The first concave-convex pattern 1315 may be spaced apart from the second concave-convex pattern 1325. The second concave-convex pattern 1325 may have a shape such that the second concave-convex pattern 1325 is insertable into the first concave-convex pattern 1315.

In example embodiments, the first concave-convex pattern 1315 may include first convex portions 1311 and first concave portions 1312. The first convex portions 1311 and the first concave portions 1312 may be alternately arranged in a first direction D1 that is parallel to an upper surface of the lower protection film 1300. The second concave-convex pattern 1325 may include second convex portions 1321 and second concave portions 1322. The second convex portions 1321 and the second concave portions 1322 may be alternately arranged in the first direction D1. Each of the first convex portions 1311 may face each of the second concave portions 1322, and each of the first concave portions 1312 may face each of the second convex portions 1321.

As illustrated in FIG. 20, the first convex portion 1311 may protrude in a fourth direction D4. The second concave portion 1322 may include a recess toward a second direction D2 from the bending region 50. The second concave portion 1322 may expose a lower surface of the second lower protection film pattern 1302 that is located in the bending region 50. The lower protection film 1300 may include PET, PEN, PP, PC, PS, PSul, PE, PPA, PES, PAR, PCO, MPPO, etc. In example embodiments, the lower protection film 1300 may include PET.

As illustrated in FIG. 21, when the bending region 50 of the OLED device 1000 is bent on an axis with respect to the first direction D1, the first convex portion 1311 may be inserted into the second concave portion 1322. For example, when the bending region 50 of the OLED device 1000 is bent on an axis with respect to the first direction D1, an upper surface of the first convex portion 1311 may be in direct contact with a lower surface of the second lower protection film pattern 1302 located adjacent to the bending region 50.

For example, when the bending region 50 is bent, the pad electrode region 60 may be located on a lower surface of the OLED device 1000. In example embodiments, the bending region 50 may be bent on an axis with respect to the first direction D1, and the second lower protection film pattern 1302 may be disposed on a lower surface of the first lower protection film pattern 1301. In some implementations, after the bending region 50 is bent, an adhesive tape may be interposed between the second lower protection film pattern 1302 and the first lower protection film pattern 1301. For example, the adhesive tape may include urethane, rubber, and/or the like. The second lower protection film pattern 1302 and the first lower protection film pattern 1301 may be fixed by the adhesive tape. In addition, the adhesive tape may absorb shock.

In the OLED device 1000 in accordance with example embodiments, when bending region 50 is bent on an axis with respect to the first direction D1, each of the first convex portions 1311 may be inserted into each of the second concave portions 1322, and each of the second convex portions 1321 may be inserted into each of the first concave portion 1312. Accordingly, a dead space may be reduced because a bending radius of curvature is relatively decreased. The OLED device 1000 may have a joining structure where the convex portions and the concave portions are combined. Accordingly, the bending region 50 of the OLED device 1000 may have a strong joining structure that is not easily affected or transformed by an external impact although the bending region 50 is bent on an axis with respect to the first direction D1.

Embodiments may be applied to various display devices including an organic light emitting display device. For example, embodiments may be applied to vehicle-display device, a ship-display device, an aircraft-display device, portable communication devices, display devices for display or for information transfer, a medical-display device, etc.

By way of summation and review, a general flexible OLED device has been developed in which a portion of the general OLED device is capable of bending or folding. The general flexible OLED device may include lower and upper substrates that include flexible materials. For example, the lower substrate included in the display panel may be formed of a flexible substrate, and the upper substrate included in the display panel may have a thin film encapsulation structure. The general flexible OLED device may further include a lower protection film that is located on a lower surface of the display panel. A portion of the lower protection film may be removed in a portion where the flexible OLED device is bent by using a heat block. However, in the general flexible OLED device, a step (or bump) may be generated on the lower protection film that is adjacent to the portion where the flexible OLED device is bent. A dead space may be increased and there is a risk that a contact failure could occur because a bending radius of curvature is increased due to the step when the lower protection film is bent In the OLED device in accordance with example embodiments, when the bending region is bent on an axis with respect to a first direction, each of first convex portions may be inserted into each of second concave portions, and each of second convex portions may be inserted into each of first concave portion. Accordingly, a bending radius of curvature is relatively decreased and a dead space may be reduced. In addition, the OLED device may have a joining structure where the convex portions and the concave portions are combined. Accordingly, the bending region of the OLED device may have a strong joining structure that is not easily damaged or transformed by an external impact even when the bending region is bent on an axis with respect to the first direction.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting display (OLED) device, comprising:
a display panel having a display region where a plurality of pixels are disposed and a pad region located in a first side of the display region, the pad region including a bending region located in a portion of the pad region that is adjacent to the display region and a pad electrode region located in a remaining portion of the pad region, the pad electrode region being where pad electrodes are disposed; and
a lower protection film on a lower surface of the display panel such that a portion of the bending region is exposed, the lower protection film including:
  a first lower protection film including a first concave-convex pattern in a portion of the bending region located adjacent to the display region; and
  a second lower protection film spaced apart from the first lower protection film, the second lower protection film including a second concave-convex pattern in a portion of the bending region located adjacent to the pad electrode region, the second concave-convex pattern having a shape such that the second concave-convex pattern is insertable into the first concave-convex pattern.

2. The OLED device as claimed in claim 1, wherein:
the first lower protection film is located in the display region and in a portion of the bending region that is located adjacent to the display region, and
the second lower protection film is located in the pad electrode region and in a portion of the bending region that is located adjacent to the pad electrode region.

3. The OLED device as claimed in claim 1, wherein:
the first concave-convex pattern includes two adjacent first convex portions and a first concave portion that is located between the two adjacent first convex portions, and
the second concave-convex pattern includes two adjacent second concave portions and a second convex portion that is located between the two adjacent second concave portions.

4. The OLED device as claimed in claim 3, wherein:
the two adjacent first convex portions face the two adjacent second concave portions, and
the first concave portion faces the second convex portion.

5. The OLED device as claimed in claim 4, wherein:
each of the first convex portions protrudes in a direction from the display region into the bending region, and
the second convex portion protrudes in a direction from the pad electrode region into the bending region, and
a first empty space that is located between the adjacent two first convex portions is defined as the first concave portion, and
second and third empty spaces that are located in both lateral portions of the second convex portion are defined as the second concave portions.

6. The OLED device as claimed in claim 4, wherein:
each of the first and second lower protection films has a first thickness in the display region and the pad region,
each of the first and second convex portions have a second thickness in the bending region, and
the first thickness is less than the second thickness.

7. The OLED device as claimed in claim 1, wherein the lower protection film has a zipper shape in the bending region when viewed in a plan view of the OLED device.

8. The OLED device as claimed in claim 1, wherein:
the first concave-convex pattern includes a plurality of first convex portions and a plurality of first concave portions, and
the first convex portion and the first concave portion are alternately arranged in a first direction that is parallel to an upper surface of the lower protection film, the second concave-convex pattern is spaced apart from the first concave-convex pattern and includes a plurality of second convex portions and a plurality of second concave portions, and the second convex portion and the second concave portion are alternately arranged in the first direction.

9. The OLED device as claimed in claim 8, wherein: each of the first convex portions faces a corresponding one of the second concave portions, and each of the first concave portions faces a corresponding one of the second convex portions.

10. The OLED device as claimed in claim 8, wherein: the number of first convex portions is the same as the number of second concave portions, and
the number of first concave portions is the same as the number of second convex portions.

11. The OLED device as claimed in claim 8, wherein: the first convex portion protrudes in a second direction that is perpendicular to the first direction,
the second convex portion protrudes in a third direction that is opposite to the second direction, and
the first and second convex portions protrude in a fourth direction that is vertical to the first, second, and third direction.

12. The OLED device as claimed in claim 11, wherein: the first concave portion includes a recess toward the third direction from the bending region, and
the second concave portion includes a recess toward the second direction from the bending region.

13. The OLED device as claimed in claim 11, wherein the first and second concave portions expose a lower surface of the display panel located in the bending region.

14. The OLED device as claimed in claim 11, wherein the first convex portion is insertable into the second concave portion and the second convex portion is insertable into the first concave portion when the bending region of the OLED device is bent.

15. The OLED device as claimed in claim 11, wherein, when the bending region of the OLED device is bent, an upper surface of the first convex portion is in contact with a lower surface of the display panel located adjacent to the pad electrode region, and an upper surface of the second convex portion is in contact with a lower surface of the display panel located adjacent to the display region.

16. The OLED device as claimed in claim 11, wherein: the second direction is a direction from the display region into the pad region,
the third direction is a direction from the pad region into the display region,
the fourth direction is a direction from the display panel into the lower protection film, and
the bending region is bendable on an axis with respect to the first direction.

17. The OLED device as claimed in claim 1, wherein each of the pixels included in the display panel includes:
a substrate on the lower protection film;
a semiconductor element on the substrate;
a lower electrode on the semiconductor element;
a light emitting layer on the lower electrode;
an upper electrode on the light emitting layer; and
a thin film encapsulation structure on the upper electrode.

18. The OLED device as claimed in claim 17, wherein the semiconductor element includes:
an active layer on the substrate;
a gate insulation layer on the active layer;
a gate electrode on the gate insulation layer;
an insulating interlayer on the gate electrode; and
source and drain electrode on the insulating interlayer.

19. The OLED device as claimed in claim 17, wherein the thin film encapsulation structure includes:
a first thin film encapsulation layer on the upper electrode and including inorganic materials;
a second thin film encapsulation layer on the first thin film encapsulation layer and including organic materials; and
a third thin film encapsulation layer on the second thin film encapsulation layer and the inorganic materials, and
wherein the substrate and the thin film encapsulation structure include materials having a flexibility.

20. The OLED device as claimed in claim 1, further comprising a touch screen electrode layer and a polarizing layer disposed on the display panel.

* * * * *